(12) United States Patent
Hayata

(10) Patent No.: US 12,261,148 B2
(45) Date of Patent: Mar. 25, 2025

(54) WIRE BONDING APPARATUS

(71) Applicant: SHINKAWA LTD., Tokyo (JP)

(72) Inventor: Shigeru Hayata, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 101 days.

(21) Appl. No.: 18/008,179

(22) PCT Filed: Jun. 1, 2021

(86) PCT No.: PCT/JP2021/020814
§ 371 (c)(1),
(2) Date: Dec. 5, 2022

(87) PCT Pub. No.: WO2021/246396
PCT Pub. Date: Dec. 9, 2021

(65) Prior Publication Data
US 2023/0178510 A1    Jun. 8, 2023

(30) Foreign Application Priority Data
Jun. 5, 2020 (JP) .................................. 2020-098350

(51) Int. Cl.
*H01L 23/00* (2006.01)

(52) U.S. Cl.
CPC .... *H01L 24/78* (2013.01); *H01L 2224/78001* (2013.01); *H01L 2224/78353* (2013.01);
(Continued)

(58) Field of Classification Search
None
See application file for complete search history.

(56) References Cited

U.S. PATENT DOCUMENTS 6,945,446 B2    9/2005  Hayata
10,118,246 B2   11/2018 Hayata et al.
(Continued)

FOREIGN PATENT DOCUMENTS

JP    H08306732    11/1996
JP    H10242191    9/1998
(Continued)

OTHER PUBLICATIONS

Office Action of Korea Counterpart Application, with English translation thereof, issued on Mar. 8, 2024, pp. 1-9.
(Continued)

*Primary Examiner* — Devang R Patel
(74) *Attorney, Agent, or Firm* — JCIPRNET

(57) ABSTRACT

A wire bonding apparatus is provided with: a bonding stage on which a semiconductor chip is mounted; a wire bonding unit including a capillary bonding a bonding wire to the semiconductor chip, a Z-axis drive section reciprocating the capillary, and a tool XY-stage causing the capillary and the Z-axis drive section to be moved along a two-dimensional plane intersecting a direction of reciprocation; and a base having an optical system and an optical system XY-stage causing the optical system to be moved along a two-dimensional plane intersecting a direction of reciprocation, the base having the wire bonding unit attached thereto. The wire bonding unit is attached to a first portion of the base, and the optical system XY-stage is attached to a second portion of the base which is separate from the first portion.

17 Claims, 18 Drawing Sheets

(52) U.S. Cl.
CPC ............... *H01L 2224/78753* (2013.01); *H01L 2224/78804* (2013.01); *H01L 2224/78824* (2013.01); *H01L 2224/78901* (2013.01)

(56) References Cited

U.S. PATENT DOCUMENTS

| | | | |
|---|---|---|---|
| 10,262,968 B2 | 4/2019 | Hayata et al. | |
| 2003/0098426 A1* | 5/2003 | Hayata | H01L 24/78 |
| | | | 250/559.34 |
| 2003/0123866 A1* | 7/2003 | Hayata | H01L 24/78 |
| | | | 396/80 |
| 2004/0060663 A1* | 4/2004 | Haraguchi | B23K 20/005 |
| | | | 382/145 |
| 2009/0059361 A1* | 3/2009 | Hayata | H01L 24/78 |
| | | | 359/372 |

FOREIGN PATENT DOCUMENTS

| | | | | |
|---|---|---|---|---|
| JP | 2001189342 A | * | 7/2001 | ........... B23K 20/004 |
| JP | 2003163243 | | 6/2003 | |
| JP | 2007248473 | | 9/2007 | |
| JP | 2008306040 | | 12/2008 | |
| KR | 20170096044 | | 8/2017 | |
| WO | 2016158588 | | 10/2016 | |

OTHER PUBLICATIONS

"International Search Report (Form PCT/ISA/210) of PCT/JP2021/020814," mailed on Aug. 17, 2021, with English translation thereof, pp. 1-4.

"Office Action of Taiwan Counterpart Application", issued on May 16, 2023, with English translation thereof, pp. 1-7.

* cited by examiner

| Operation | Optical system XY-stage | First field-of-view | Tool XY-stage | Z-axis drive section | Second field-of-view | Calculation |
|---|---|---|---|---|---|---|
| Set bonding point (S31) | Move onto semiconductor chip (S31a) | Semiconductor chip (S31b) | | | | |
| | Set center of field-of-view at bonding point (S31c) | | | | | |
| | | | Move to reference point (S31d) | | | |
| | | | | | Image reference point (S31e) | Set coordinates of tool XY-stage to (x0, y0). Set reference point position (x0s', y0s') in camera coordinates of second field-of-view through image recognition. Obtain coordinates (x0s, y0s) by converting reference point position into coordinates of tool XY-stage. (S31f) |
| | Evacuate (S31g) | | | | | |
| Bonding or indentation formation (S32) | | | Move to bonding point (S32a) | | | |
| | | | | Perform bonding (S32b) | | |
| | | | Evacuate (S32c) | | | |
| Calculate bonding position (S33) | Move onto semiconductor chip (S33a) | | | | | |
| | | Image bonding point (S33b) | | | | Obtain bonding position with respect to center of first field-of-view. Obtain bonding point (Xb', Yb') on basis of camera coordinates of first field-of-view. Obtain coordinates (Xb, Yb) by conversion into coordinates of tool XY-stage. (S33c) |
| | | | Move to reference point (S33d) | | | |
| | | | | | Image reference point (S33e) | Set coordinates of tool XY-stage to (x1, y1). Set reference point position (x1s', y1s') in camera coordinates of second field-of-view through image recognition. Obtain coordinates (x1s, y1s) by converting reference point position into coordinates of tool XY-stage. (S33f) |

| Operation | Optical system XY-stage | Image acquisition — First field-of-view (high magnification) | Image acquisition — First field-of-view (low magnification) | Tool XY-stage | Image acquisition — Second field-of-view |
|---|---|---|---|---|---|
| Lead locator (S7) | Move onto individual leads (S7a) | | Obtain images of individual leads (S7b) | | |

(b)

| Operation | Optical system XY-stage | Image acquisition — First field-of-view (high magnification) | Image acquisition — First field-of-view (low magnification) | Tool XY-stage | Image acquisition — Second field-of-view |
|---|---|---|---|---|---|
| Alignment (S81) | Move onto first lead alignment point L1, first chip alignment point A1, and second chip alignment point A2 (S81a) | Obtain images of first chip alignment point A1 and second chip alignment point A2 (S81b) | Obtain image of first lead alignment point L1 (S81c) | | |
| Obtain relationship of relative positions between tool XY-stage and camera (S82) | | | | Move to reference point (S82a) | Obtain image of reference point (S82b) |
| Alignment (S83) | Second lead alignment point L2 (S83a) | | Obtain image of second lead alignment point L2 (S83b) | | |
| Obtain relationship of relative positions between tool XY-stage and camera (S84) | | | | Move to reference point (S84a); Evacuate (S84c) | Obtain image of reference point (S84b) |

| t | Operation | Optical system XY-stage | First field-of-view | Tool XY-stage | Z-axis drive section | Second field-of-view | Calculation |
|---|---|---|---|---|---|---|---|
| | Set bonding point (S91) | Move onto semiconductor chip (S91a) | Semiconductor chip (S91b) | | | | |
| | | Set bonding point by reticle within screen (S91c) | | | | | Obtain relative position of set bonding point with respect to characteristic pattern A in first field-of-view. Relative position follows camera coordinates (Xb2', Yb2'). (S91d) |
| | | Evacuate (S91e) | | | | | |
| | | | | Move to reference point (S91f) | | Reference point (S91g) | |
| | | | | | | | Obtain reference point position within field-of-view through image recognition of reference point. (S91h) |
| | Bonding or indentation formation (S92) | | | Move to bonding point (S92a) | | | |
| | | | | | Perform bonding (S92b) | | |
| | | | | Evacuate (S92c) | | | |
| | Calculate bonding position (S93) | Move onto device (S93a) | | | | | |
| | | | Image bonding point (S93b) | | | | |
| | | | | | | | Obtain relative position of set bonding point with respect to characteristic pattern A in first field-of-view. Relative position follows camera coordinates (Xb3', Yb3'). (S93c) |

FIG. 18

WIRE BONDING APPARATUS

CROSS-REFERENCE TO RELATED APPLICATION

This application is a 371 application of the International PCT application serial no. PCT/JP2021/020814, filed on Jun. 1, 2021, which claims the priority benefit of Japan Patent Application No. 2020-098350, filed on Jun. 5, 2020. The entirety of each of the above-mentioned patent applications is hereby incorporated by reference herein and made a part of this specification.

TECHNICAL FIELD

The present invention relates to a wire bonding apparatus.

BACKGROUND ART

Patent Literatures 1 and 2 disclose wire bonding apparatuses. The wire bonding apparatuses bond bonding wires to desired positions on substrates or semiconductor chips by using capillaries. Position control based on image processing, for example, is performed to cause the capillaries to correctly move to the bonding positions.

CITATION LIST

Patent Literatures

Patent Literature 1: Japanese Patent Laid-Open No. H08-306732
Patent Literature 2: Japanese Patent Laid-Open No. H10-242191

SUMMARY OF INVENTION

Technical Problem

In the technical field of wire bonding, it has been desired to reliably bond a bonding wire to a target. A property at the bonded part called bondability is affected by some factors during bonding work. If vibration is applied from the outside to the capillary during the bonding work, and unintended vibration occurs in the capillary, for example, the bondability is degraded.

An objective of the present invention is to provide a wire bonding apparatus capable of curbing degradation of bondability.

Solution to Problem

A wire bonding apparatus according to an aspect of the present invention includes: a bonding stage on which a bonding target is mounted; a wire bonding unit including a capillary bonding a bonding wire to the bonding target, a capillary drive section reciprocating the capillary, and an XY-stage causing the capillary and capillary drive section to be moved along a two-dimensional plane intersecting a direction of reciprocation; an imaging unit imaging the bonding target mounted on the bonding stage; and a base to which the wire bonding unit and the imaging unit are attached. The wire bonding unit is attached to a first portion of the base. The imaging unit is attached to a second portion that is different from the first portion of the base.

In the wire bonding apparatus, each of the wire bonding unit and the imaging unit is attached to a different portion of the base. Thus, vibration caused by operations of the imaging unit is sufficiently attenuated before it reaches the wire bonding unit. As a result, the vibration caused by operations of the imaging unit is thus unlikely to affect operations of the wire bonding unit. Therefore, it is possible to perform bonding in a satisfactory state and to thereby curb degradation of bondability.

In an aspect, the imaging unit may image a reference point that represents the position of the wire bonding unit and image the bonding target mounted on the bonding stage. With this configuration, it is possible to suitably perform calibration of the imaging unit with respect to the wire bonding unit.

In an aspect, the imaging unit may obtain a first image including the reference point and a second image that includes the bonding target and is different from the first image. With this configuration, it is also possible to suitably perform calibration of the imaging unit with respect to the wire bonding unit.

In an aspect, the wire bonding apparatus may further include: a control section acquiring a calibration value obtained by calculating a correlation between field-of-view coordinates of the reference point in the first image and position coordinates of the XY-stage. With this configuration, it is also possible to suitably perform calibration of the imaging unit with respect to the wire bonding unit.

In an aspect, the reference point may be provided on an upper surface of an ultrasonic horn of the wire bonding unit. With this configuration, it is also possible to suitably perform calibration of the imaging unit with respect to the wire bonding unit.

In an aspect, the imaging unit may include an imaging device and an optical system guiding light from the bonding target and the reference point to the imaging device. The optical system may include a lens and an optical splitter section disposed on an optical axis between the imaging device and the bonding target and between the imaging device and the reference point. The lens may be disposed on the imaging device side. The optical splitter section may be disposed on the bonding target side and on the reference point side. With this configuration, it is possible to simply perform calibration of the imaging unit with respect to the wire bonding unit.

In an aspect, the optical splitter section may include a half mirror and an illumination irradiating the half mirror with light. The optical splitter section may perform switching between an optical path acquiring the first image and an optical path acquiring the second image with the light with which the half mirror is irradiated. With this configuration, it is also possible to simply perform calibration of the imaging unit with respect to the wire bonding unit.

Effects of Invention

According to the present invention, a wire bonding apparatus capable of curbing degradation of bondability is provided.

Figure 5:
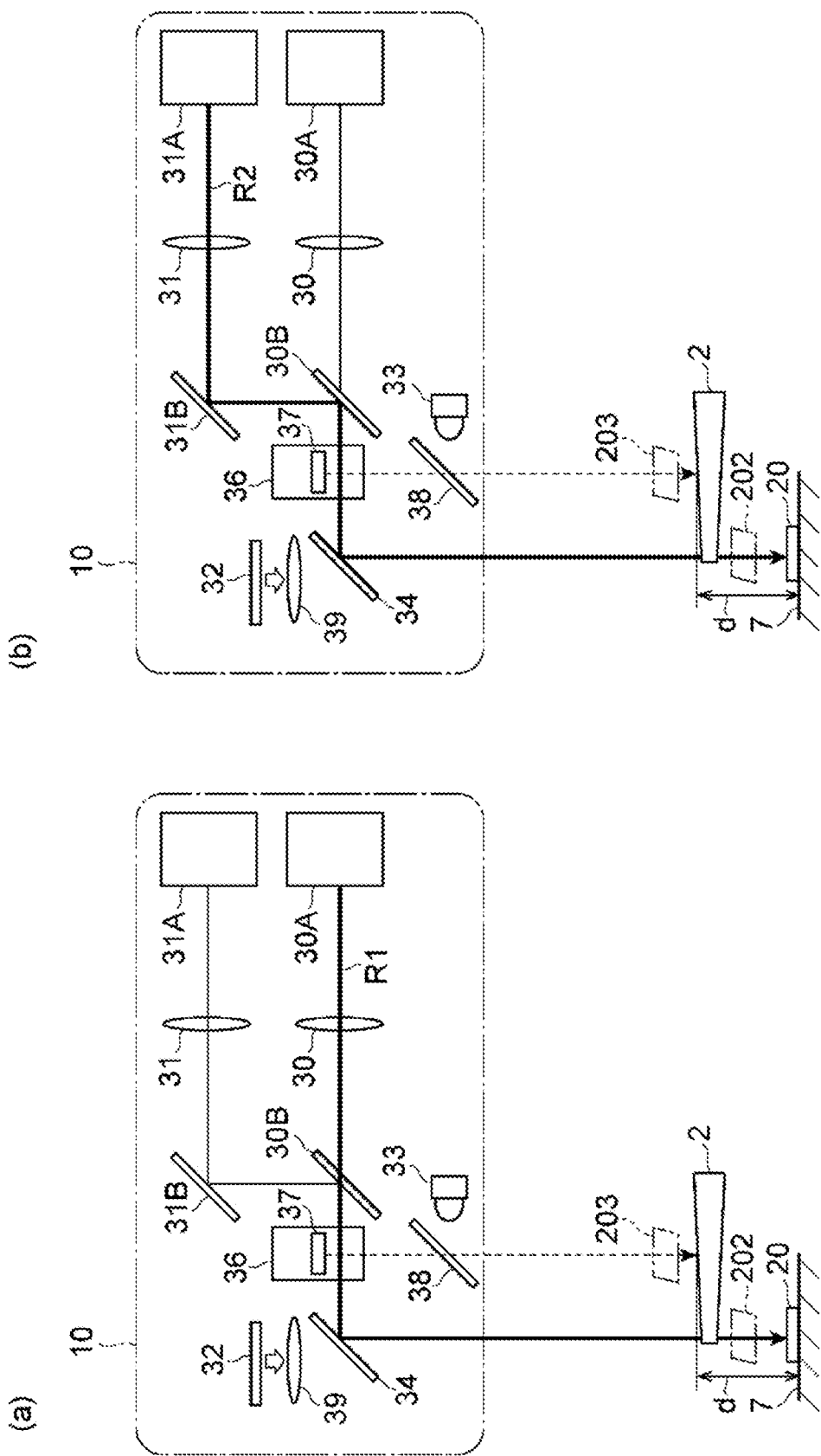

(a) of FIG. 5 is a diagram illustrating a first optical path;
(b) of FIG. 5 is a diagram illustrating a second optical path.

Figure 6:
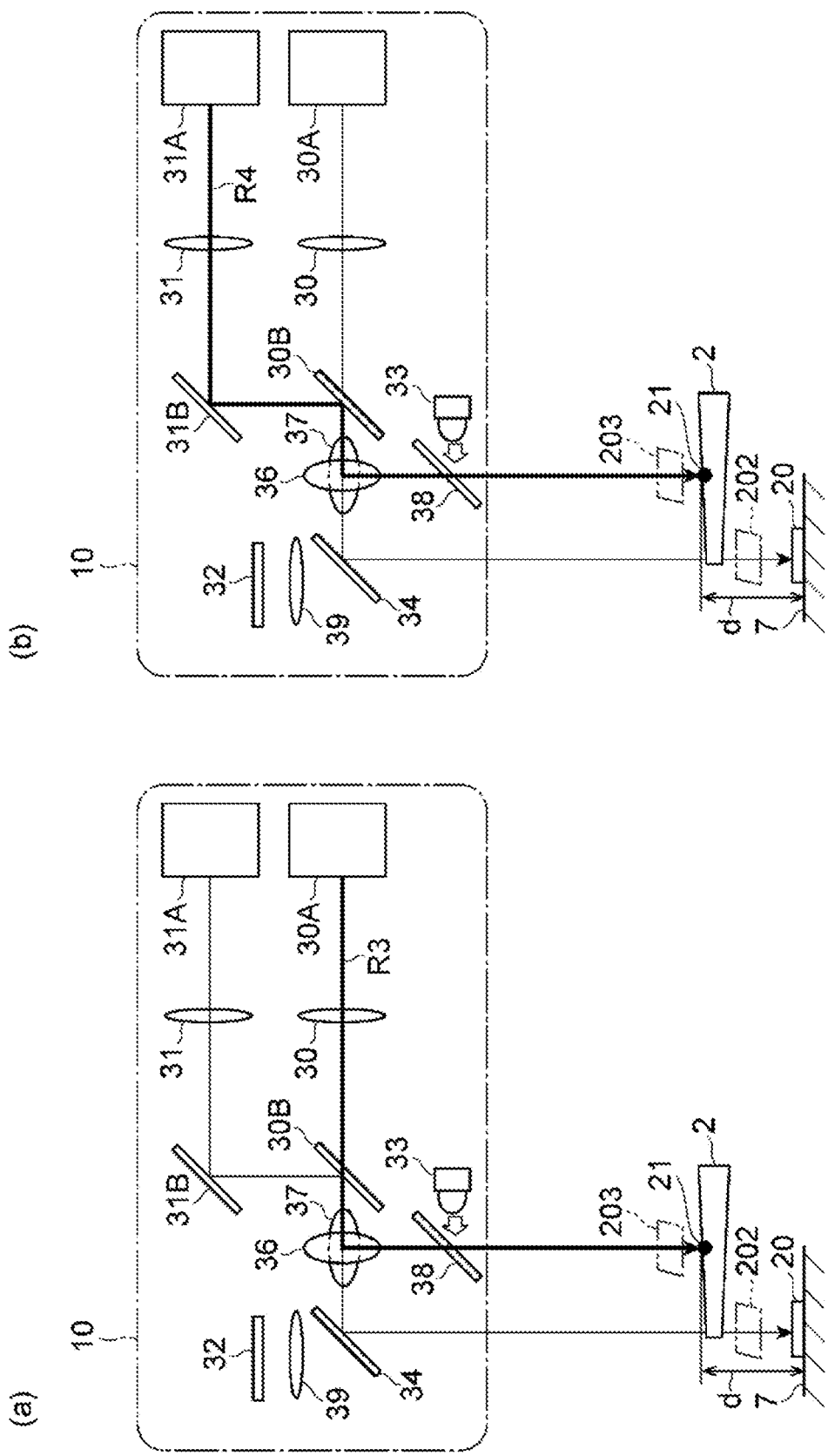

(a) of FIG. 6 is a diagram illustrating a third optical path;
(b) of FIG. 6 is a diagram illustrating a fourth optical path.

Figure 7:
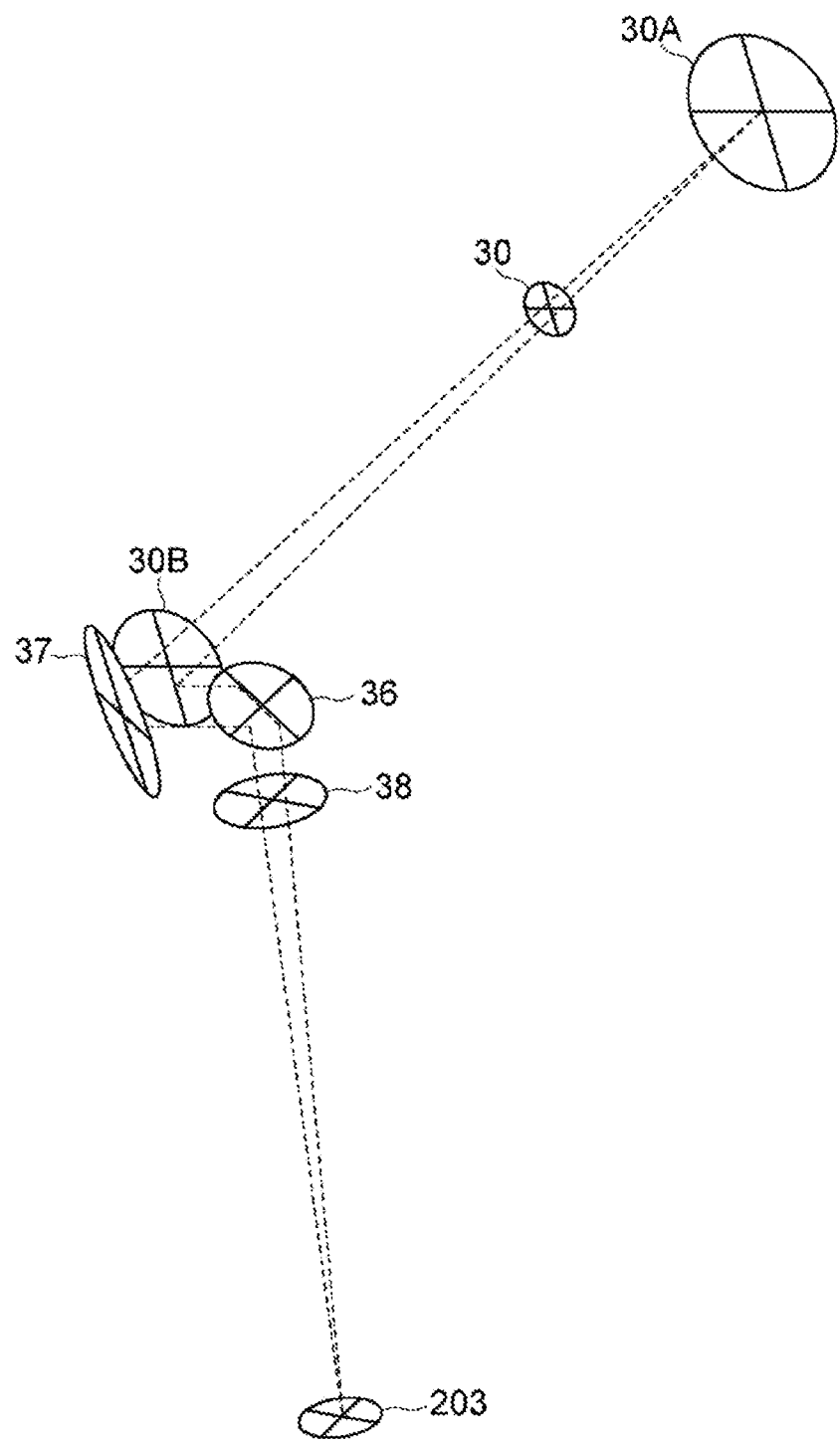

FIG. 7 is a diagram of the third optical path of the imaging unit seen from an oblique direction.

Figure 8:
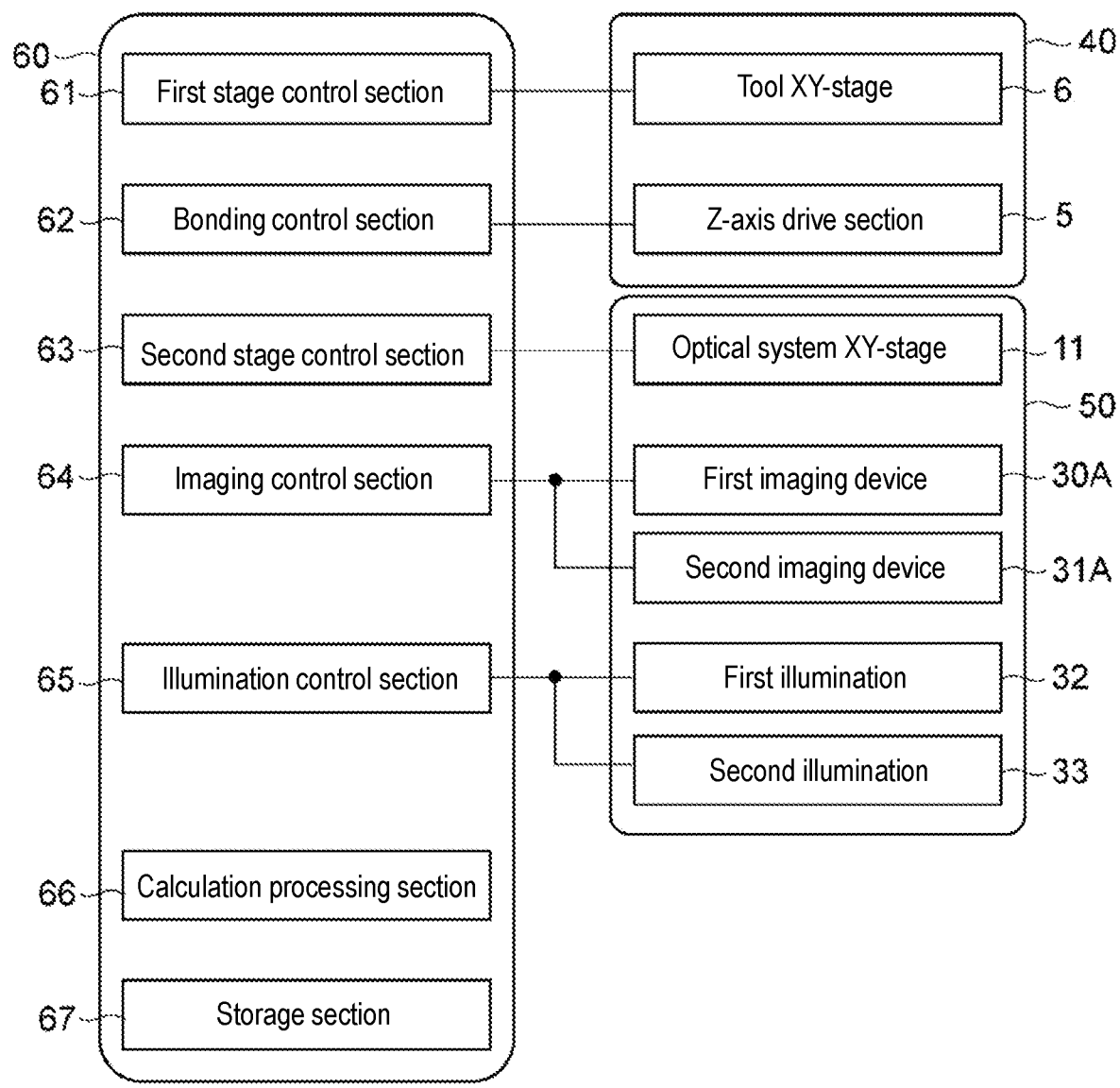

FIG. 8 is a functional block diagram of a controller.

Figure 9:
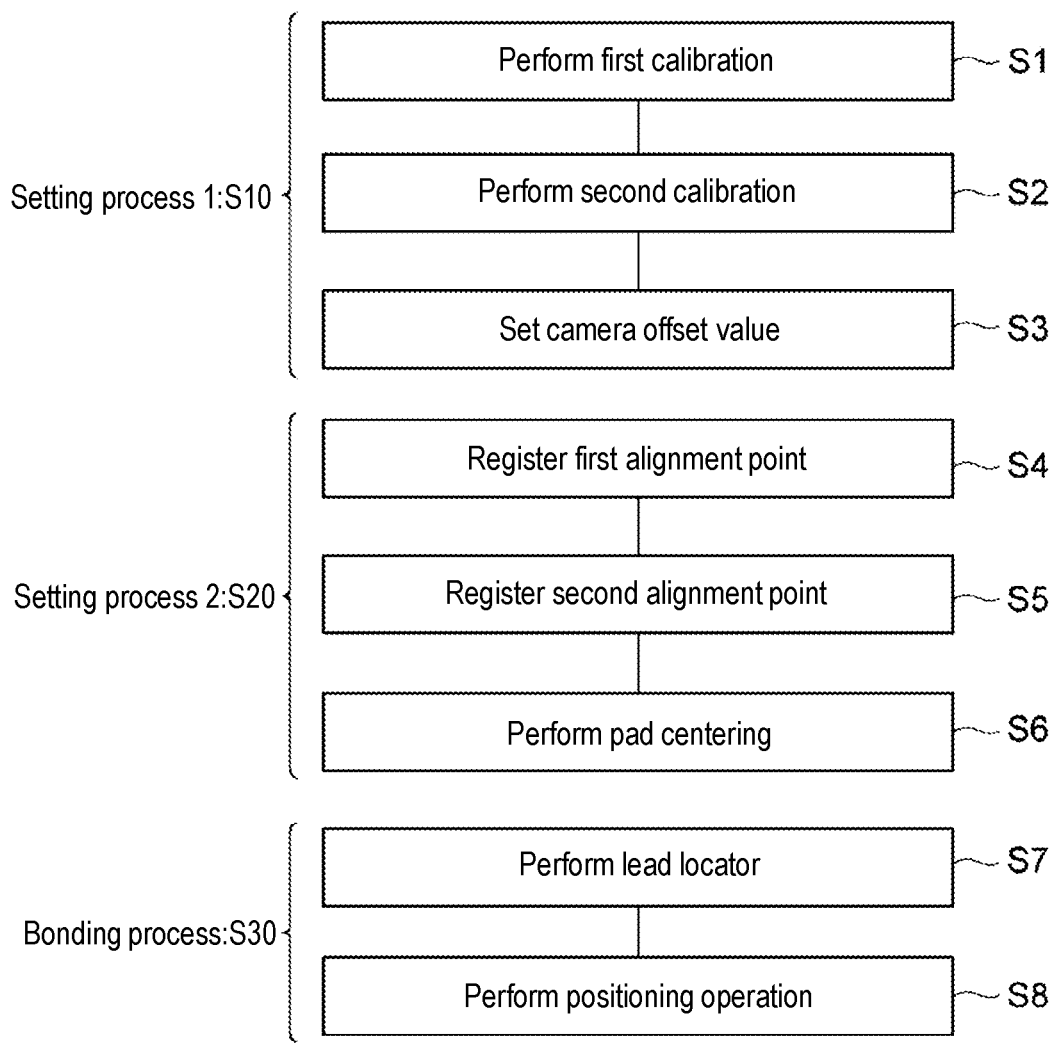

FIG. 9 is a flow diagram illustrating main processes of a wire bonding method.

FIG. 10 is a process table illustrating details of a process of setting a camera offset value.

Figure 11:
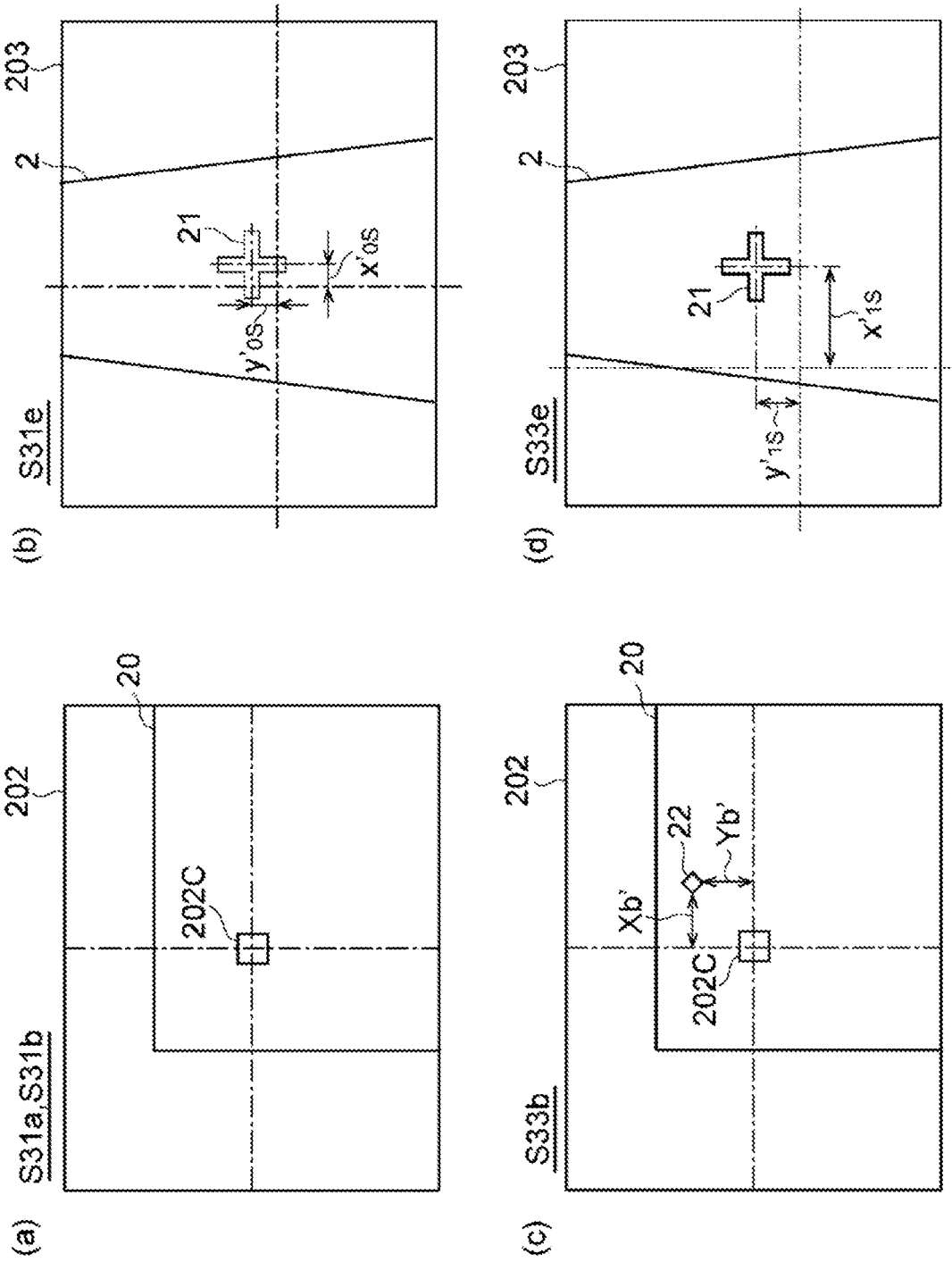

(a) to (d) of FIG. 11 illustrate examples of images acquired in the process of setting the camera offset value.

(a) and (b) of FIG. 12 are process tables illustrating details of a process of performing a positioning operation.

Figure 13:
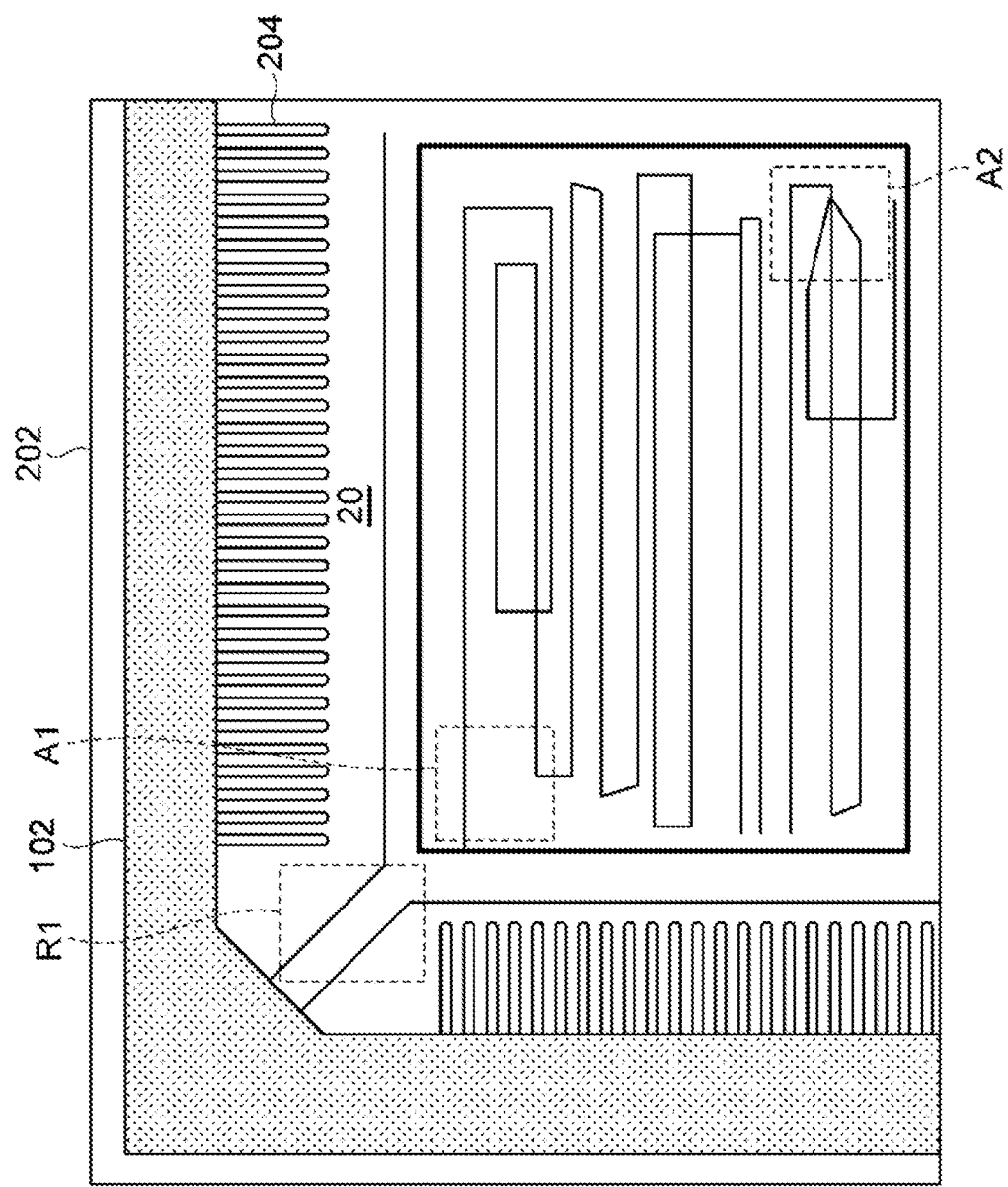

FIG. 13 illustrates an example of an image for explaining the process of performing the positioning operation.

Figure 14:
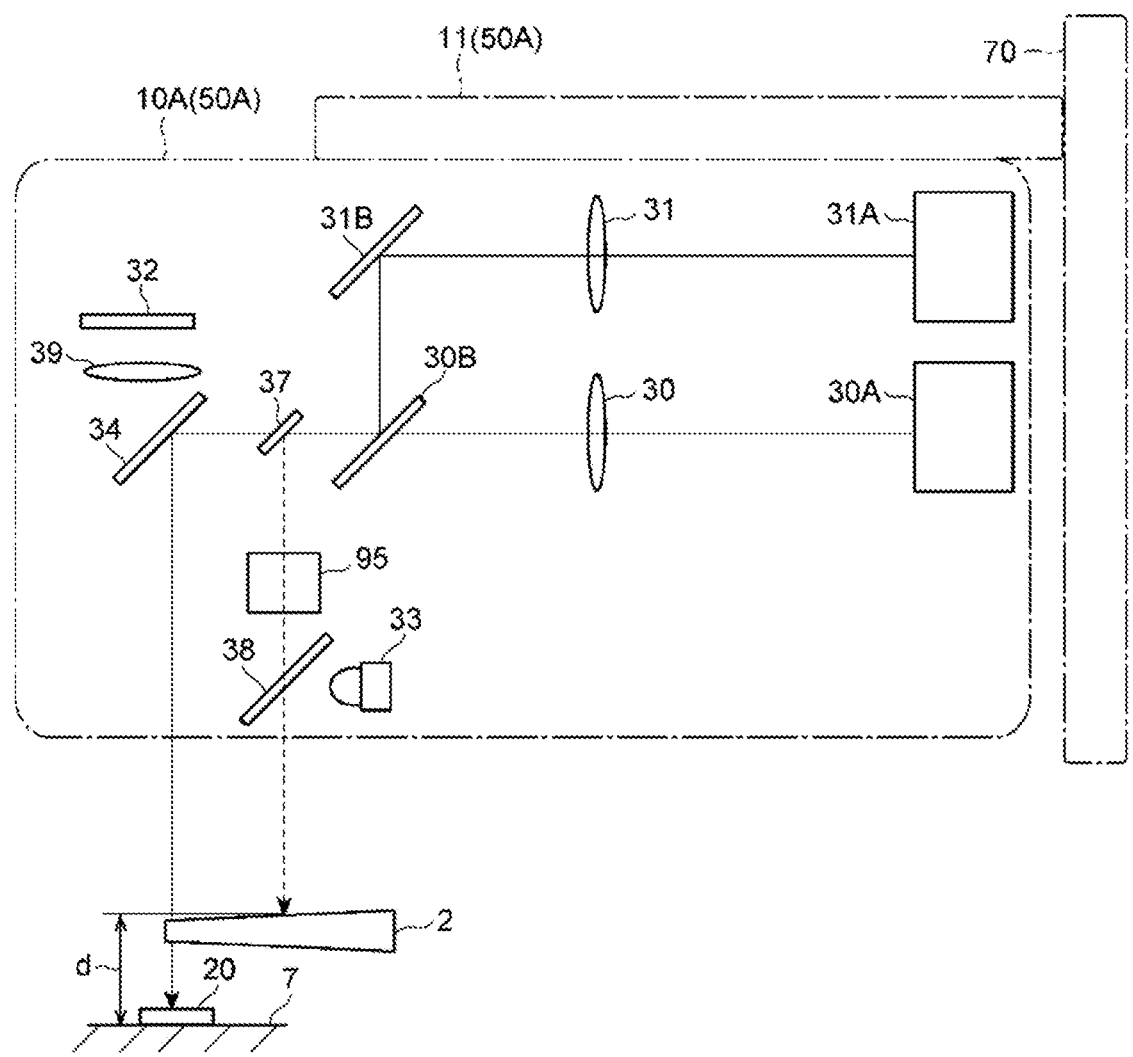

FIG. 14 is a diagram of a modification of the imaging unit seen from a side.

Figure 15:
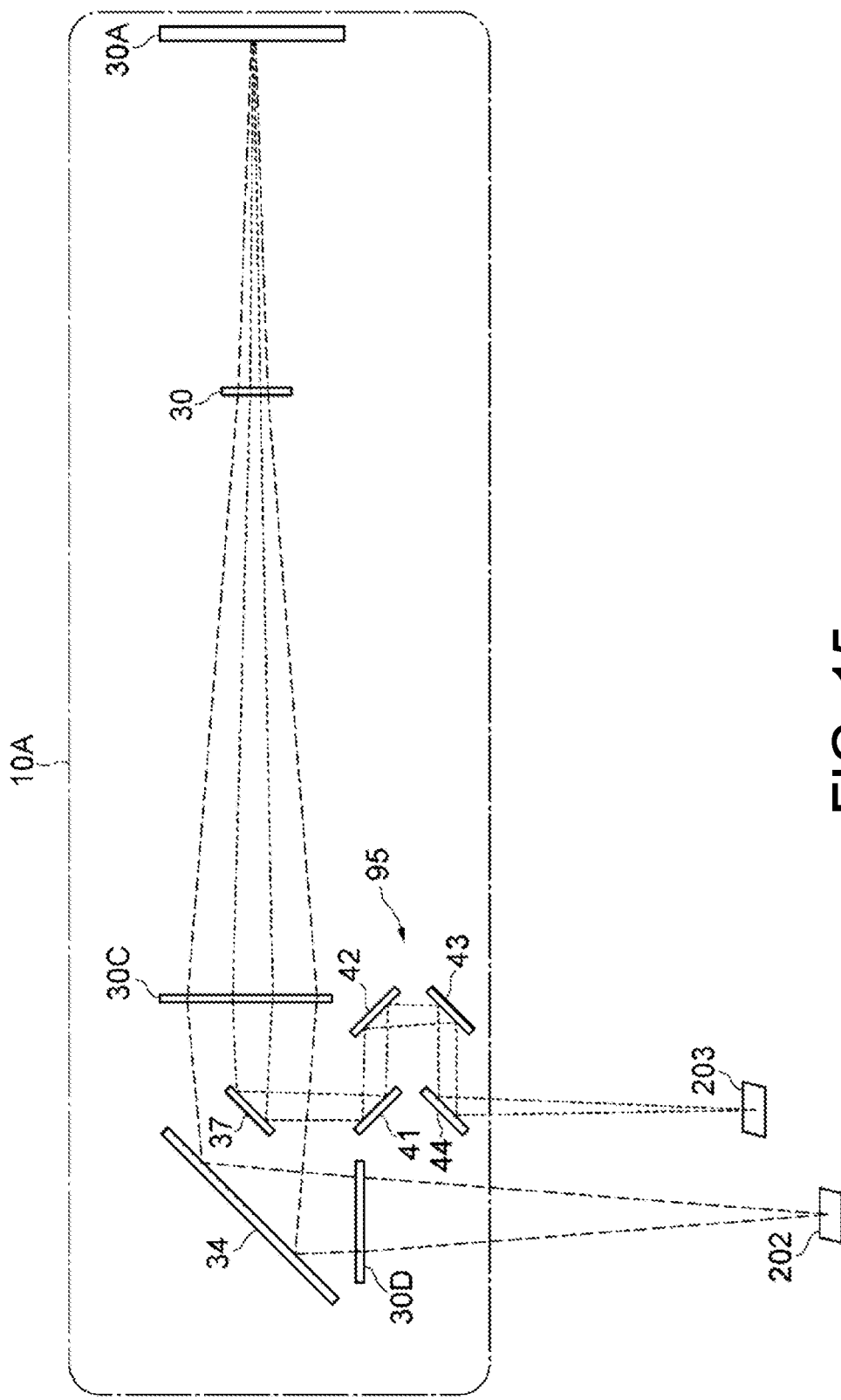

FIG. 15 is a diagram of the modification of the imaging unit seen from a side in detail.

Figure 16:
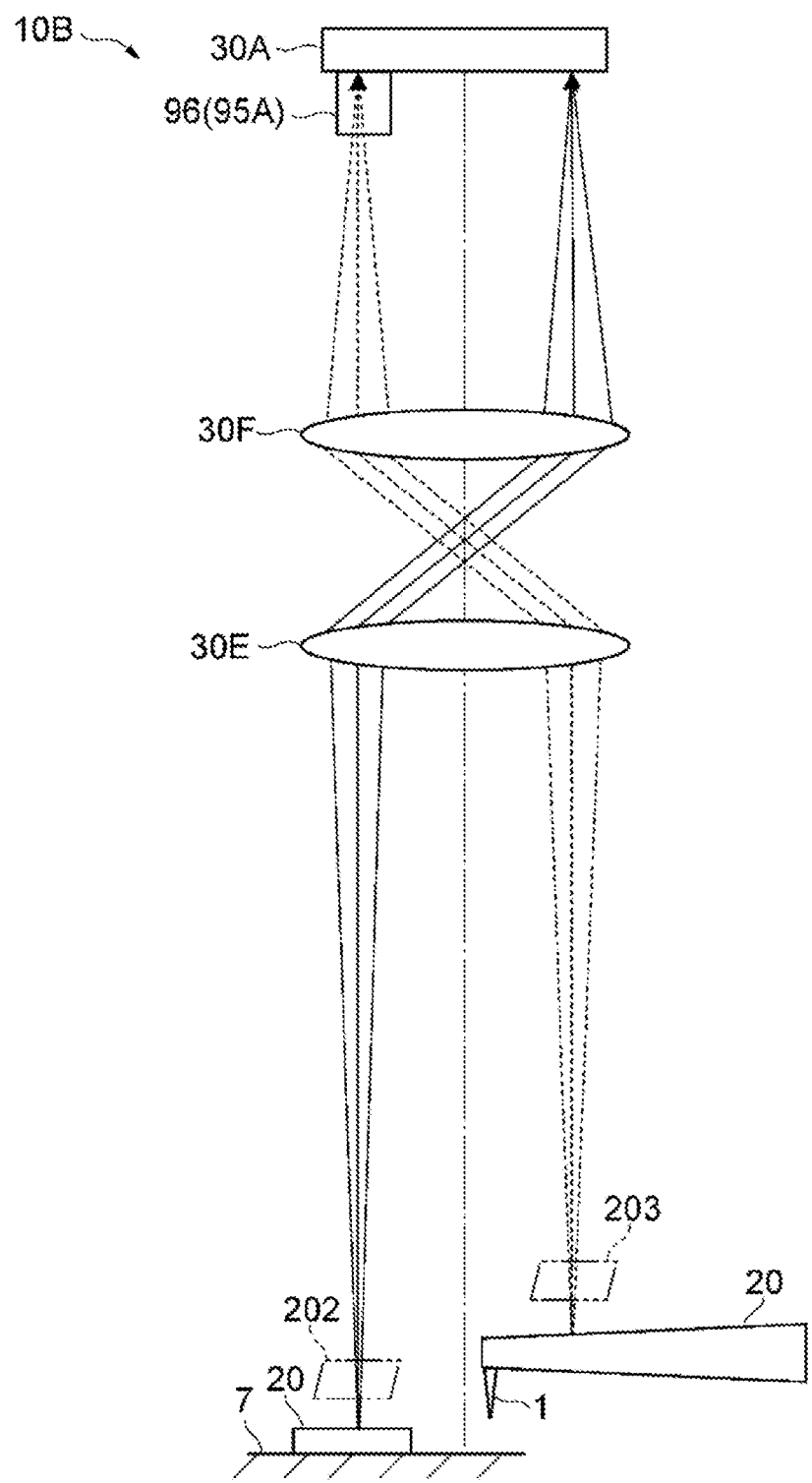

FIG. 16 is a diagram of a yet another modification of the imaging unit seen from a side.

Figure 17:
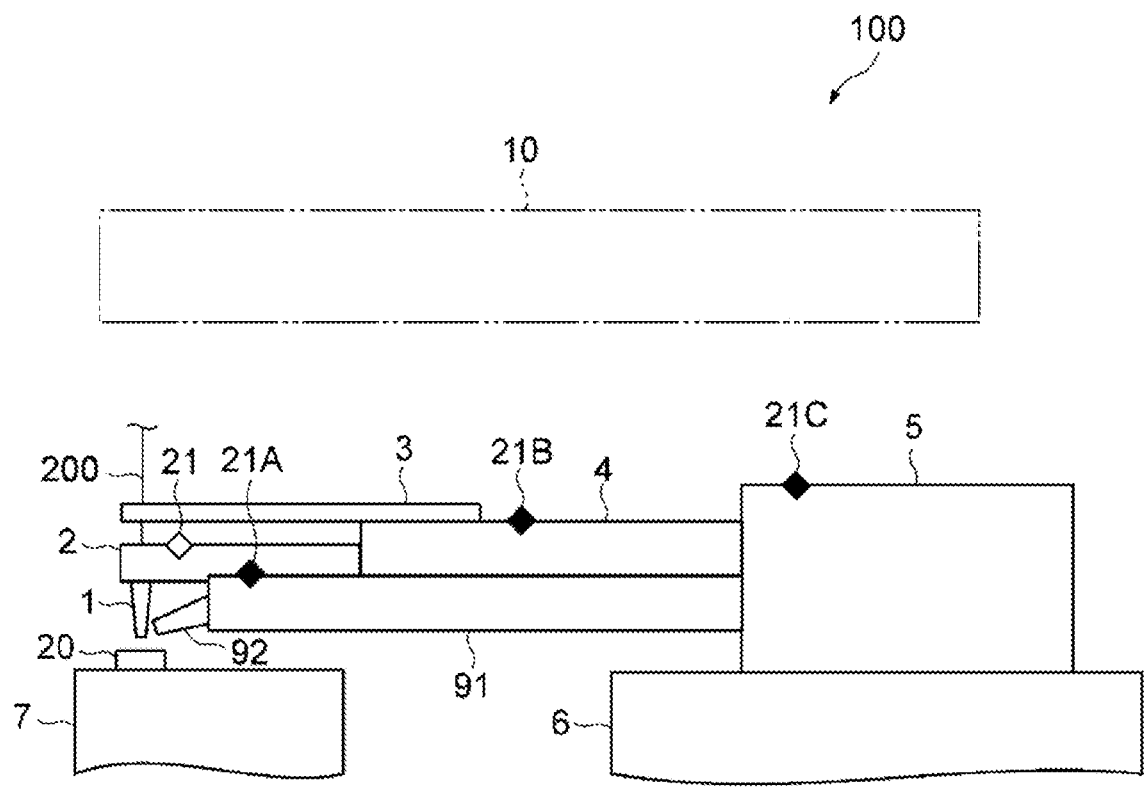

FIG. 17 is a side view of a wire bonding apparatus illustrating a modification of a reference point.

FIG. 18 is a process table illustrating details of a modification of the process of setting the camera offset value.

DESCRIPTION OF EMBODIMENTS

Hereinafter, modes for carrying out the present invention will be described in detail with reference to the accompanying drawings. In the description of the drawings, the same elements will be denoted by the same reference signs, and repeated description will be omitted.

Figure 1:
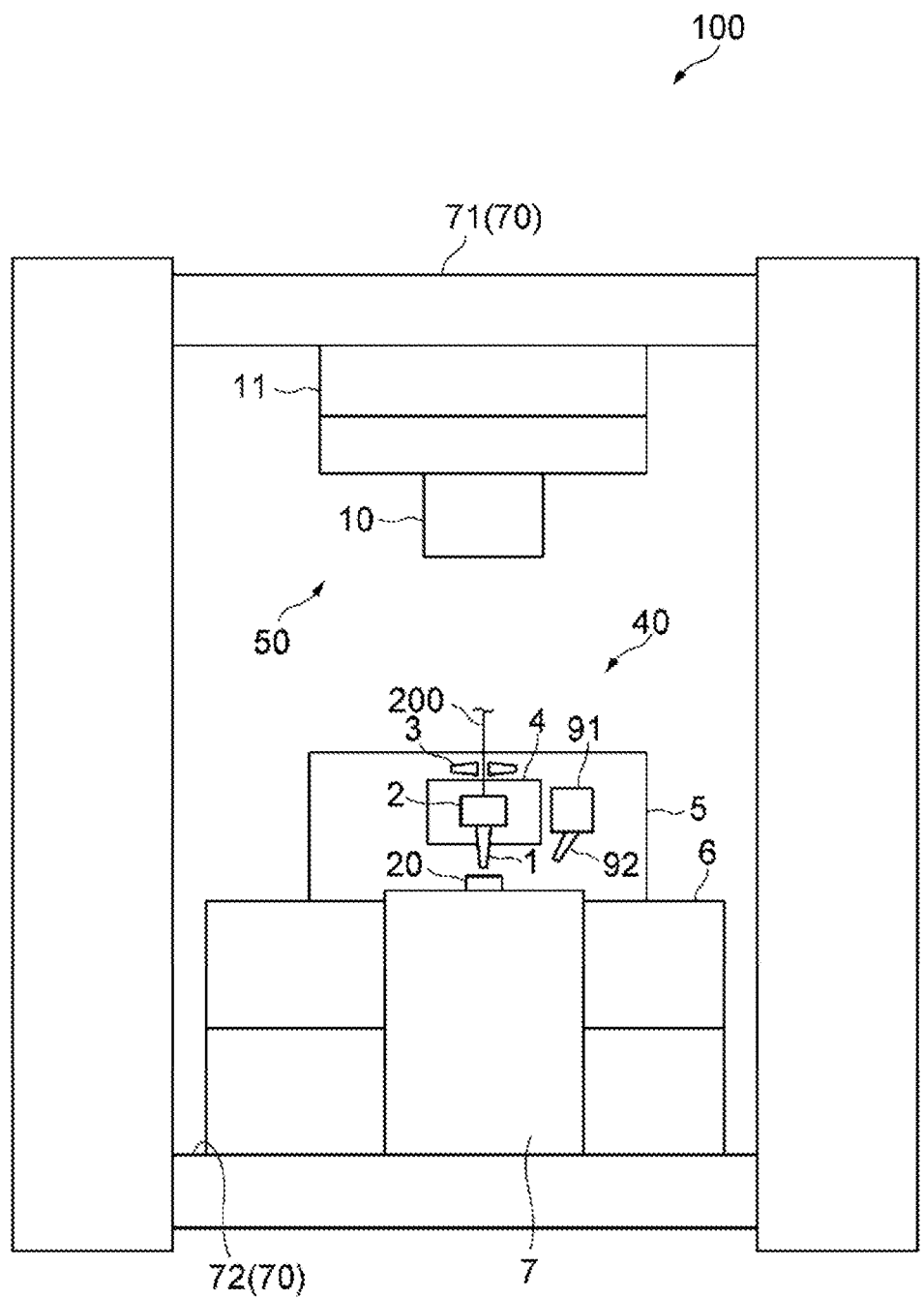
FIG. 1 is a diagram of a wire bonding apparatus according to an embodiment seen from the front.
Figure 2:
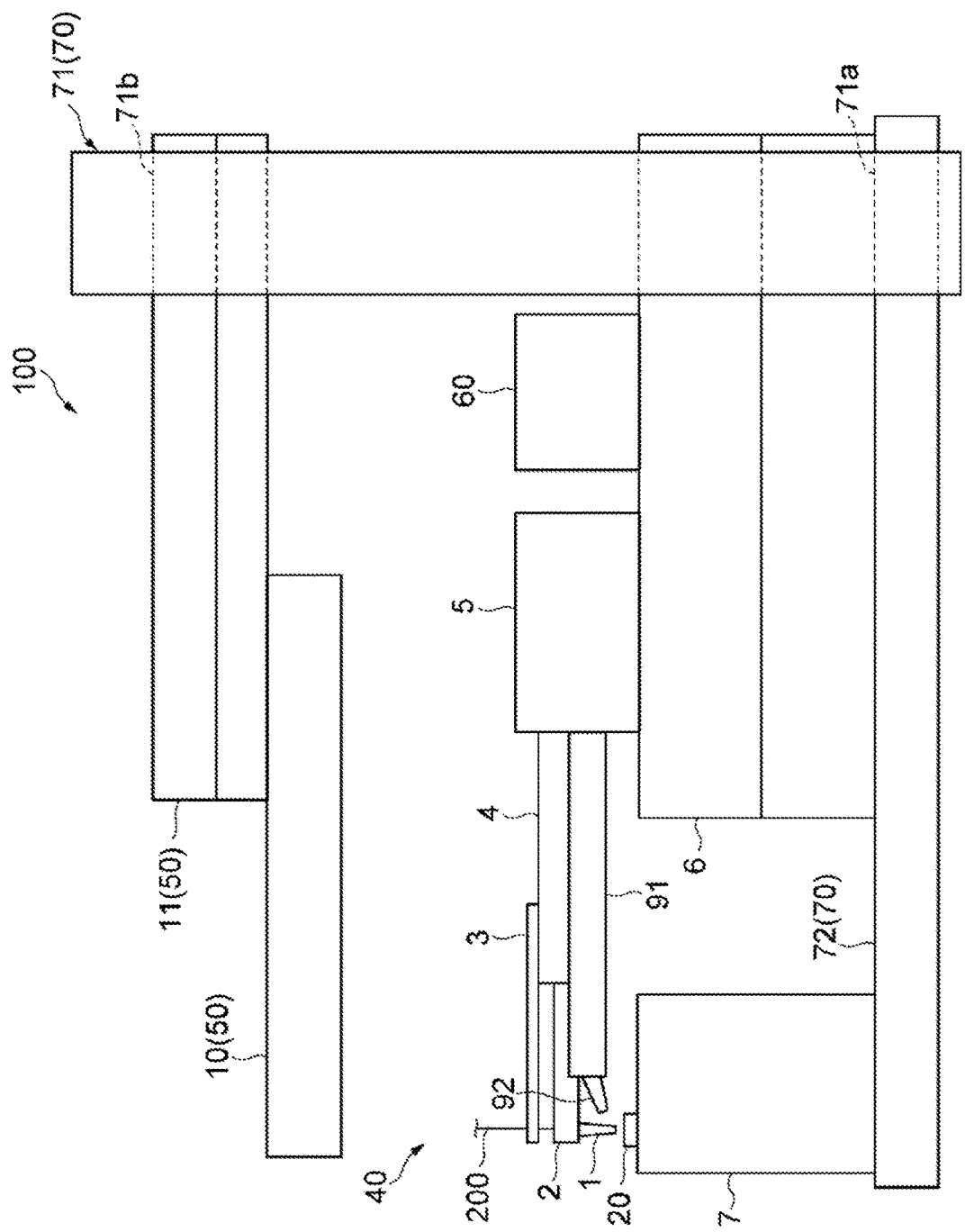
FIG. 2 is a diagram of the wire bonding apparatus according to the embodiment seen from a side.

FIG. 1 is a front view of a wire bonding apparatus 100 according to an embodiment of the present invention. FIG. 2 is a side view of the wire bonding apparatus 100 illustrated in FIG. 1. The wire bonding apparatus 100 bonds a bonding wire 200 to a semiconductor chip 20.

The wire bonding apparatus 100 includes, as main components, a wire bonding unit 40, an imaging unit 50, a controller 60 (control section: see FIG. 2), and a base 70. The wire bonding unit 40 bonds the bonding wire 200 to the semiconductor chip 20. The imaging unit 50 obtains an image for controlling operations of the wire bonding unit 40. The controller 60 controls operations of the wire bonding unit 40 and the imaging unit 50. For example, the controller 60 controls the imaging unit 50. As a result, an image including the semiconductor chip 20, a capillary 1, and the like is obtained.

The controller 60 controls the wire bonding unit 40 through processing of the image. The control of the wire bonding unit 40 includes a series of operations such as position control of the distal end of the capillary 1 with respect to the semiconductor chip 20 and control of a wire bonding operation performed by the capillary 1. At least the wire bonding unit 40 and the imaging unit 50 are attached to the base 70. The base 70 holds the relative position of the imaging unit 50 with respect to the wire bonding unit 40. The controller 60 may be attached to the base 70. The controller 60 may not be attached to the base 70.

Wire Bonding Unit

The wire bonding unit 40 includes the capillary 1, an ultrasonic horn 2, a wire clamper 3, a horn holder 4, a Z-axis drive section 5 (capillary drive section), and a tool XY-stage 6 (XY-stage).

The capillary 1 which is a bonding tool bonds the bonding wire 200 to the semiconductor chip 20. The capillary 1 is detachably attached to the ultrasonic horn 2 on the distal end side. The ultrasonic horn 2 on the proximal end side is attached to the horn holder 4 on the distal end side. The wire clamper 3 on the proximal end side is also attached to the horn holder 4 on the distal end side in addition to the ultrasonic horn 2. The wire clamper 3 on the distal end side is located substantially above the capillary 1.

The horn holder 4 on the proximal end side is attached to the Z-axis drive section 5. The Z-axis drive section 5 which is a bonding head causes the horn holder 4 to move along an arc trajectory. With the movement of the horn holder 4 along the arc trajectory, the capillary 1, the ultrasonic horn 2, and the wire clamper 3 attached directly or indirectly to the horn holder 4 also move along the arc trajectory. With the movement of the capillary 1 along the arc trajectory, the capillary 1 performs a bonding operation. A torch arm 91 is also attached to the Z-axis drive section 5. An adapter 92 for a torch (not illustrated) is attached to the torch arm 91 on the distal end side. The Z-axis drive section 5 is attached to the tool XY-stage 6. The capillary 1, the ultrasonic horn 2, the wire clamper 3, the horn holder 4, and the Z-axis drive section 5 attached directly or indirectly to the Z-axis drive section 5 can move in parallel along an XY plane. The tool XY-stage 6 is a high-speed high-precision stage using a servo motor. The bonding stage 7 is disposed below the capillary 1. The bonding stage 7 holds the semiconductor chip 20 below the capillary 1.

In short, the capillary 1 which is a bonding tool attached to the ultrasonic horn 2 and the Z-axis drive section 5 which performs the bonding operation by causing the capillary 1 to move along the arc trajectory are installed on the tool XY-stage 6 in the wire bonding unit 40.

Imaging Unit

The imaging unit 50 obtains an image for positioning the capillary 1. The imaging unit 50 which is an optical system for positioning includes an another optical system XY-stage 11 which is independent from the tool XY-stage 6.

The imaging unit 50 includes an optical system 10 (imaging section) and an optical system XY-stage 11 (camera drive section). The optical system 10 obtains images with mutually different imaging ranges. For example, the optical system 10 obtains an image including a marker for specifying the position of the semiconductor chip 20 and an image including a reference point 21 (which will be described later) for specifying the position of the capillary 1. The optical system 10 obtains images with mutually different imaging magnifications. The optical system XY-stage 11 causes the optical system 10 to move relative to an imaging target. The imaging target is a semiconductor chip 20, an ultrasonic horn 2 provided with the reference point 21, or the like.

Figure 3:
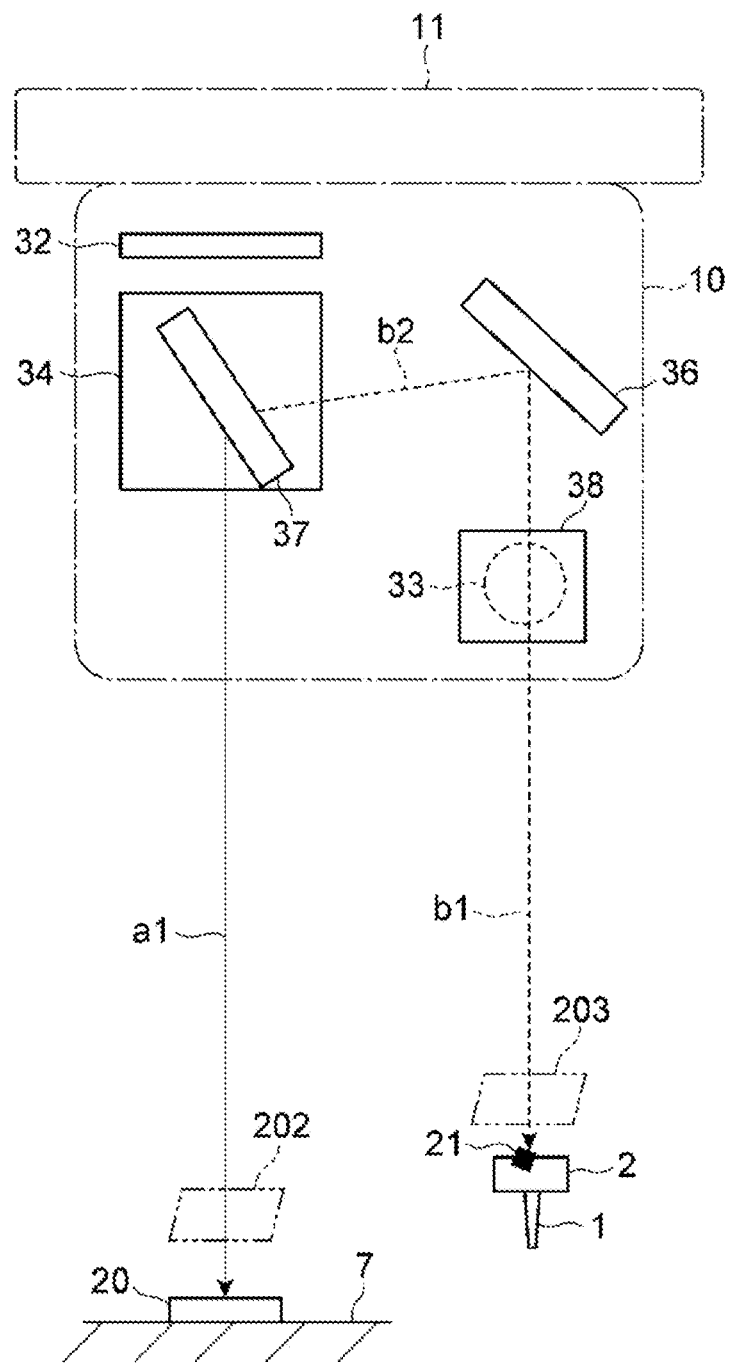
FIG. 3 is a diagram of an imaging unit seen from the front.
Figure 4:
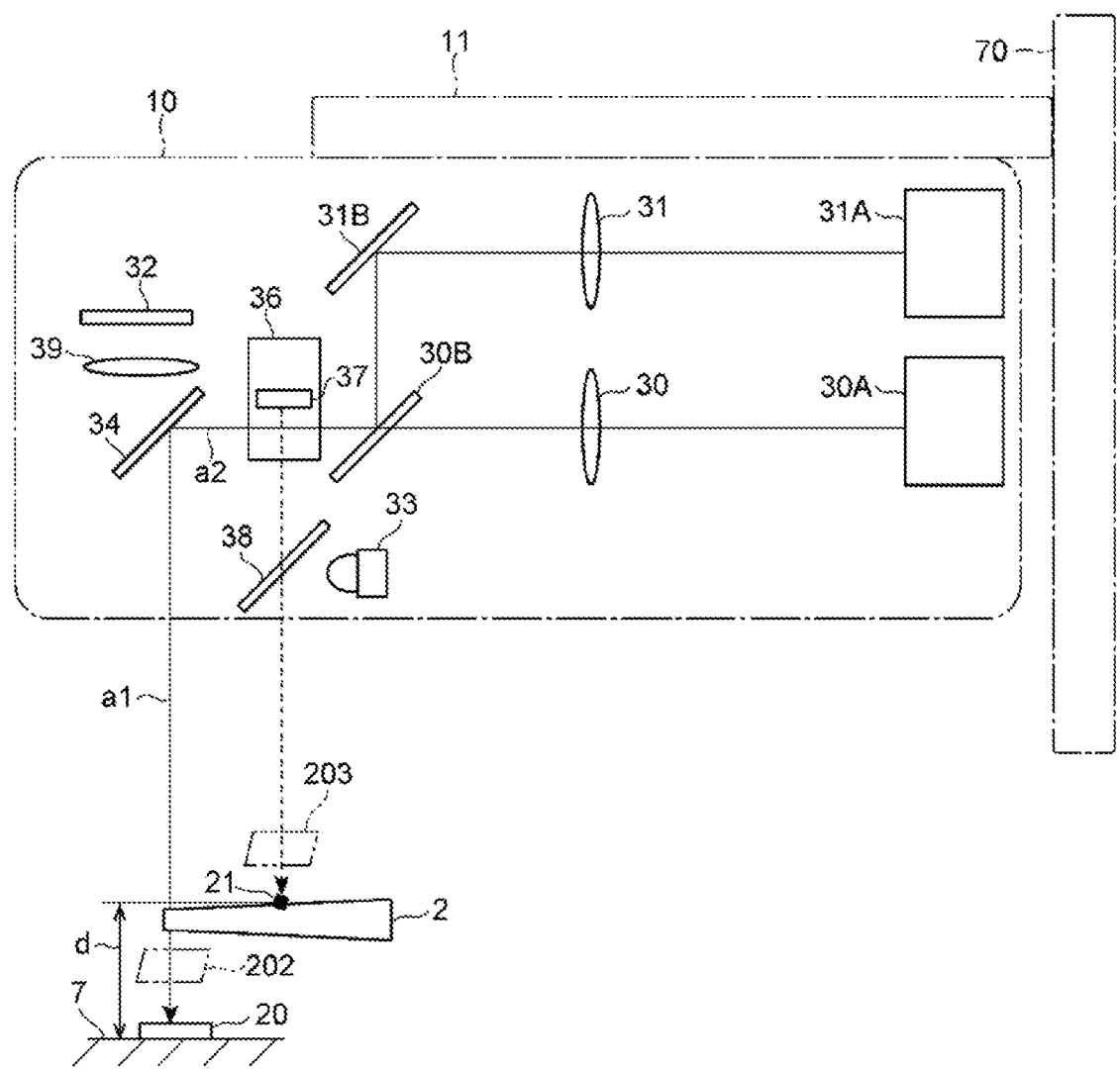
FIG. 4 is a diagram of the imaging unit seen from a side.

FIG. 3 is a view of the optical system 10 seen from the front. FIG. 4 is a view of the optical system 10 seen from a side. As illustrated in FIG. 3 and FIG. 4, the optical system 10 includes a first imaging device 30A, a second imaging device 31A, a mirror 36, half mirrors 30B, 31B, 34, 37, and 38, a first illumination 32, a second illumination 33, a first optical part 30, a second optical part 31, and a third optical part 39.

The first imaging device 30A obtains an image at a high magnification. The second imaging device 31A obtains an image at a low magnification. The first imaging device 30A and the second imaging device 31A may be high-pixel cameras, for example. In a case where high-pixel cameras having a size of 1.1 inches and 12 million pixels are employed as the first imaging device 30A and the second imaging device 31A, for example, the field-of-view size is 4.2 mm×3.5 mm on the assumption that the magnification is two times. The field-of-view size is about double a low-power field of twin-lens barrel that a conventional wire bonder has. In this case, a pixel resolution is 1.7 μm/pixel. It is possible to realize recognition precision of some fraction to one tenth of the pixel resolution through image processing. When required bonding precision is 2 μm, for example, it is possible to secure recognition precision which is sufficient for a high-precision wire bonder. In a case of a twin-lens barrel of a low magnification and a high magnification, it is possible to reduce the number of times imaging is performed at a lead locator, which will be described. In a case where a high-pixel camera is used and it is possible to secure a wide field-of view, the optical system 10 may have a single lens.

The optical system 10 obtains an image of an object that is present in a first field-of-view 202 and an image of an object that is present in a second field-of-view 203. Therefore, the optical system 10 configures a first optical path R1 (see FIG. (a) of FIG. 5) and a second optical path R2 (see (b) of FIG. 5). The first optical path R1 guides light from the first field-of-view 202 to the first imaging device 30A. The second optical path R2 guides light from the first field-of-view 202 to the second imaging device 31A. Moreover, the optical system 10 configures a third optical path R3 (see (a) of FIG. 6) and a fourth optical path R4 (see (b) of FIG. 6). The third optical path R3 guides light from the second field-of-view 203 to the first imaging device 30A. The fourth optical path R4 guides light from the second field-of-view 203 to the second imaging device 31A.

The position of the first field-of-view 202 is different from the position of the second field-of-view 203. The optical path length from the first optical part 30 to the semiconductor chip 20 which is an imaging target is the same as the optical path length from the second optical part 31 to the reference point 21 which is an imaging target. Specifically, the optical path length can be represented as a1+a2=b1+b2. a1 is the optical path length from the semiconductor chip 20 to the half mirror 34. a2 is the optical path length from the half mirror 34 to the half mirror 37. b1 is the optical path length from the reference point 21 to the mirror 36. b2 is the optical path length from the mirror 36 to the half mirror 37. The magnifications related to calibration values, which will be described later, are the same for the first field-of-view 202 and the second field-of-view 203.

As illustrated in (a) of FIG. 5, the first optical path R1 guides light from the first field-of-view 202 to the first imaging device 30A. The semiconductor chip 20 is disposed in the first field-of-view 202. Therefore, the first optical path R1 guides light from the semiconductor chip 20 to the first imaging device 30A. The first optical path R1 is configured of the half mirror 34 (optical splitter section) and the first optical part 30.

As illustrated in (b) of FIG. 5, the second optical path R2 guides light from the first field-of-view 202 to the second imaging device 31A. Therefore, the second optical path R2 guides light from the semiconductor chip 20 to the second imaging device 31A. The second optical path R2 is configured of the half mirrors 34, 37, 30B, and 31B and the second optical part 31.

In short, light from the semiconductor chip 20 is split to the optical path through which the light is guided to the first optical part 30 on the high magnification side by the half mirror 30B and the optical path through which the light is guided to the second optical part 31 on the low magnification side, after passing through the half mirrors 34 and 37. The light guided to the first optical part 30 on the high magnification side is imaged by the first imaging device 30A for the high magnification. The light guided to the second optical part 31 on the low magnification side is imaged by the second imaging device 31A for the low magnification. The field of view for imaging the semiconductor chip 20 by these optical paths is referred to as the first field-of-view 202.

As illustrated in (a) of FIG. 6 and FIG. 7, the third optical path R3 guides light from the second field-of-view 203 to the first imaging device 30A. The reference point 21 provided at the ultrasonic horn 2 is disposed in the second field-of-view 203. Therefore, the third optical path R3 guides light from the reference point 21 to the first imaging device 30A. The third optical path R3 is configured of the mirror 36, the half mirror 37, and the first optical part 30.

The second field-of-view 203 is for imaging the reference point 21 at an arbitrary location on the tool XY-stage 6. The reference point 21 is a marker formed on the upper surface of the ultrasonic horn 2. The reference point 21 is provided at a part which can be moved by the tool XY-stage 6.

The reference point 21 is provided at the ultrasonic horn 2, for example. It is desirable that the reference point 21 be provided at a position at a short distance from the capillary 1. The wire clamper 3 is installed on the ultrasonic horn 2. However, the upper surface of the ultrasonic horn 2 can be seen from a clearance of the wire clamper 3. A recognition mark (a cross shape, for example) that facilitates image recognition and can satisfy desired precision may be applied to the upper surface of the ultrasonic horn 2. The recognition mark is the reference point 21. For example, an edge of the ultrasonic horn 2 may be employed as the reference point 21 instead of the positively provided recognition mark. Also, a surface pattern of a metal member constituting the ultrasonic horn 2 may be used as the reference point 21.

The bonding area is limited by the position of the reference point 21. In a case where precision required for positioning is relatively low, for example, it is possible to increase the degree of freedom of the position where the reference point 21 is provided. The reference point 21 is allowed to be located at a point at a long distance from the capillary 1. A degree of freedom in disposition of parts for causing the lengths of the optical paths configuring the first field-of-view 202 and the second field-of-view 203 to coincide with each other is enhanced. A modification of the reference point 21 will be described later.

As illustrated in (b) of FIG. 6, the fourth optical path R4 guides light from the second field-of-view 203 to the second imaging device 31A. Therefore, the fourth optical path R4 guides light from the reference point 21 to the second imaging device 31A. The fourth optical path R4 is configured of the mirror 36, the half mirrors 37, 30B, and 31B and the second optical part 31.

Light with which the reference point 21 is irradiated by the second illumination 33 passes through the mirror 36 and the half mirror 37 and is then split by the half mirror 30B into the optical path through which the light is guided to the first optical part 30 on the high magnification side and the optical path through which the light is guided to the second optical part 31 on the low magnification side.

The light guided to the first optical part 30 on the high magnification side is imaged by the first imaging device 30A for the high magnification. The light guided to the second optical part 31 on the low magnification side is imaged by the second imaging device 31A for the low magnification.

The first optical part 30 and the second optical part 31 which are lenses are driven in an optical axis direction and thereby perform focus adjustment.

The optical system 10 can perform mutual switching between a first field-of-view mode configuring the first optical path R1 and the second optical path R2 and a second field-of-view mode configuring the third optical path R3 and the fourth optical path R4. In other words, the optical system 10 can perform mutual switching between the first field-of-view mode in which the light from the first field-of-view 202 is guided to each of the first imaging device 30A and the second imaging device 31A and the second field-of-view mode in which the light from the second field-of-view 203 is guided to each of the first imaging device 30A and the second imaging device 31A.

The switching between the modes can be controlled by switching between turning on and off of the first illumination 32 and switching between turning on and off of the second illumination 33. The first illumination 32 is disposed behind the half mirror 34 via the third optical part 39. The first illumination 32 is disposed on an extension line of the optical axis from the half mirror 34 to the first field-of-view 202. The first illumination 32 irradiates the semiconductor chip 20 which is a target of bonding with illumination light via the third optical part 39 and the half mirror 34. The second illumination 33 is disposed behind the half mirror 38 (optical splitter section) that intersects the optical axis from the half mirror 37 to the second field-of-view 203. The second illumination 33 irradiates the reference point 21 with illumination light via the half mirror 38.

In the case of the first field-of-view mode, the first illumination 32 is turned on, and the second illumination 33 is turned off (see (a) of FIG. 5 and (b) of FIG. 5). In the case of the second field-of-view mode, the first illumination 32 is turned off, and the second illumination 33 is turned on (see (a) of FIG. 6 and (b) of FIG. 6). The turning on and off of the first illumination 32 and the turning on and off of the second illumination 33 may be controlled by control signals provided from the controller 60.

As illustrated in FIG. 4, each part configuring the optical system 10 is fixed to a frame or the like, which is not illustrated. As a result, the relative positional relationship of each part configuring the optical system 10 is maintained. The frame with the parts attached thereto is attached to the optical system XY-stage 11. The optical system XY-stage 11 is attached to the base 70. For example, the optical system XY-stage 11 has a ceiling suspended structure suspended above the wire bonding unit 40. Position precision of the optical system XY-stage 11 is not required. For example, position precision of the optical system XY-stage 11 may be lower than position precision of the tool XY-stage 6.

The first field-of-view 202 and the second field-of-view 203 are shifted in an X direction. In other words, the first field-of-view 202 is offset with respect to the second field-of-view 203. The reason that the first field-of-view 202 is offset is for avoiding interference with the bonding wire 200 extending from a bonding wire supply section (not illustrated) on the upper surface of the tool (ultrasonic horn 2) disposed in the second field-of-view 203. It is also possible to set the upper surface of the tool as the second field-of-view 203 without including the offset depending on the structure of the system for supplying the wire. A configuration of an optical system corresponding to such a case will be described later in detail as a modification.

The first field-of-view 202 and the second field-of-view 203 pass through some optical parts until the optical paths are merged by the half mirror 37. If these optical parts are deformed or cause positional deviation due to a change in temperature, an error in positioning occurs. Some measures to address the error in positioning can be listed. A first measure is to correct a temperature for image deviation. A second measure is to employ an optical part using a material with a small linear expansion coefficient. A third measure is to employ a configuration of an optical system that causes small image deviation even if a temperature change occurs. In other words, the measure is to employ a configuration of an optical system capable of canceling image deviation even if a temperature change occurs. A measure that is different from the first to third measures may be employed.

In the imaging unit 50 according to the present embodiment, the distance from a heater for heating the semiconductor chip 20 to the imaging unit 50 is longer than the distance from a heater to an imaging unit in a wire bonding apparatus with the conventional structure. In one example, the distance from the heater for heating the semiconductor chip 20 to the imaging unit 50 is about three times the distance from the heater to the imaging unit in the wire bonding apparatus with the conventional structure. Therefore, influences of a change in temperature caused by the imaging unit 50 being warmed due to heat caused by the heater are curbed.

Base

It is only necessary for the base 70 to hold the position of the imaging unit 50 with respect to the wire bonding unit 40. Therefore, the specific configuration of the base 70 is allowed to be appropriately changed in accordance with the configuration of the wire bonding unit 40, the configuration of the imaging unit 50, the position of the imaging unit 50 with respect to the wire bonding unit 40, and the like. Hereinafter, an example of the configuration of the base 70 will be described.

As illustrated in FIG. 1 and FIG. 2, the base 70 includes a main frame 71 and a sub-frame 72. The main frame 71 is a structure with high rigidity. In a case where the wire bonding unit 40 and the imaging unit 50 are attached, the main frame 71 does not cause significant deformation against a force caused by the weights and operations thereof. In a case where the capillary 1 is caused to reciprocate along an arc trajectory by the Z-axis drive section 5, for example, an excitation force is generated. The main frame 71 does not cause such significant deformation that affects precision and quality of bonding even with the excitation force. The sub-frame 72 is a mechanical interface that fixes units and parts configuring the wire bonding apparatus 100 to the main frame 71. The sub-frame 72 also causes significant deformation caused by weights of mounted elements and an external force similarly to the main frame 71.

In the example in FIG. 2, the sub-frame 72 is fixed to a first portion 71a of the main frame 71. The wire bonding unit 40 is fixed to the sub-frame 72. More specifically, the tool XY-stage 6 and the bonding stage 7 are fixed to the sub-frame 72. The wire bonding unit 40 is fixed to the main frame 71 via the sub-frame 72. The configuration is an illustrative example. For example, the wire bonding unit 40 may be fixed directly to the main frame 71. On the other hand, the imaging unit 50 is fixed directly to a second portion 71b of the main frame 71.

The wire bonding unit 40 and the imaging unit 50 are fixed in parallel to the common base 70. In other words, the imaging unit 50 is not disposed directly on the wire bonding unit 40. For example, the imaging unit 50 is not mounted on the tool XY-stage 6 of the wire bonding unit 40 in the wire bonding apparatus 100 according to the embodiment. Some structure intervenes between the wire bonding unit 40 and the imaging unit 50. For example, the main frame 71 and the sub-frame 72 intervene between the wire bonding unit 40 and the imaging unit 50.

Controller

As illustrated in FIG. 8, the controller 60 includes some functional components. The controller 60 is a computer and an electronic circuit connected to the computer, and the functional components are realized by a CPU executing a predetermined program. The controller 60 includes, as the functional components, a first stage control section 61, a bonding control section 62, a second stage control section 63, an imaging control section 64, an illumination control section 65. a calculation processing section 66, and a storage section 67. The controller 60 may further include not only these functional components but also functional components for operations required from the wire bonding apparatus 100.

The first stage control section 61 outputs a control signal to the tool XY-stage 6. The bonding control section 62 outputs the control signal to the Z-axis drive section 5. The second stage control section 63 outputs the control signal to the optical system XY-stage 11. The imaging control section 64 outputs the control signal to the first imaging device 30A and the second imaging device 31A. The imaging control section 64 receives image data from the first imaging device 30A and the second imaging device 31A. The illumination control section 65 outputs the control signal to the first illumination 32 and the second illumination 33. The calculation processing section 66 performs predetermined calculation processing using the image data and the like. The calculation processing section 66 outputs coordinate information and the like for generating the control signal to the first stage control section 61 and the second stage control section 63. The storage section 67 stores various kinds of information required for operations of the wire bonding apparatus 100.

Wire Bonding Method

Hereinafter, a wire bonding method using the wire bonding apparatus 100 will be described with reference to FIG. 9. The wire bonding method includes a device setting process and an actual bonding process. Specifically, the wire bonding method includes a setting process 1 (S10), a setting process 2 (S20), and a bonding process (S30).

The setting process 1 (S10) is a process that is not activated by the device. The setting process 1 (S10) includes Process S1 for performing first calibration, Process S2 for performing second calibration, and Process S3 for setting a camera offset value.

The setting process 2 (S20) is a process activated by the device. The setting process 2 (S20) is performed every time the bonding target is changed. The setting process 2 (S20) includes Process S4 for registering a first alignment point, Process S5 for registering a second alignment point, and Process S6 for performing pad centering.

The bonding process (S30) includes Process S7 for performing lead locator and Process S8 for performing a positioning operation.

Process for Performing First Calibration

The first calibration is an operation for obtaining a correlation between an encoder value of the tool XY-stage 6 and coordinates of a pixel in the second field-of-view 203 of the imaging unit 50. The correlation is a correlation of a scale and coordinate rotation between the XY coordinate system of the tool XY-stage 6 and the XY coordinate system in the second field-of-view 203 of the camera. The work for obtaining the correlation will be referred to as camera calibration. The origin of the XY coordinate system of the tool XY-stage 6 is set at an arbitrary position that can be read by an encoder. The origin of the XY coordinate system of the camera is set at an arbitrary position in the field of view. Hereinafter, the origin of the XY coordinate system of the camera is assumed to be the center of the field of view for easy explanation. The coordinates of the pixel in the second field-of-view 203 are an example of field-of-view coordinates. The encoder value is an example of the position coordinates.

As Process S1 for performing the first calibration, camera calibration is performed. In Process S1, a camera calibration value is obtained as information for correcting a relationship between the tool XY-stage 6 and the imaging unit 50. The camera calibration value is set for the first imaging device 30A on the low magnification side and is also set for the second imaging device 31A on the high magnification side as well.

In Process S1, (1) the reference point 21 is placed within the second field-of-view 203 by causing the tool XY-stage 6 to move first. Next, an image at a low magnification including the reference point 21 and an image at a high magnification including the reference point 21 are obtained. Then, (2) a characteristic pattern is registered from the obtained images. Next, (3) an operation of causing the tool XY-stage 6 to move at a predetermined pitch and an operation of obtaining images of the reference point 21 after moving are repeated. Also, the amount of movement of the tool XY-stage 6 is acquired using the encoder every time the XY-stage 6 is caused to move. Next, (4) the amount of movement and the direction of movement of the pattern are calculated through image recognition processing using the images obtained every time the tool XY-stage 6 is caused to move. Then, (5) a relationship (the size and the direction) between the encoder of the tool XY-stage 6 and the pixels of the first imaging device 30A and the second imaging device 31A is calculated through statistical processing of the moving amount and the moving direction of the pattern. The relationship is a first calibration value.

Process for Performing Second Calibration

The second calibration is an operation of obtaining a correlation between the encoder value or a pulse value of the optical system XY-stage 11 and the pixel in the first field-of-view 202 of the imaging unit 50. The correlation is a correlation of a scale and coordinate rotation between the XY coordinate system of the optical system XY-stage 11 and the XY coordinate system in the second field-of-view 203 of the camera. The operation of obtaining the correlation is also called camera calibration. As Process S2 for performing the second calibration, the camera calibration is performed. In Process S2, the camera calibration value is obtained as information for correcting the relationship between the optical system XY-stage 11 and the imaging unit 50. The camera calibration value is set for the first imaging device 30A on the low magnification side and is also set for the second imaging device 31A on the high magnification side as well.

In Process S2, (1) the semiconductor chip 20 is placed within the first field-of-view 202 by causing the optical system XY-stage 11 to move. Next, an image at a low magnification including the semiconductor chip 20 and an image at a high magnification including the semiconductor chip 20 are obtained. Then, (2) a characteristic pattern is registered from the obtained images. Next, (3) an operation of causing the optical system XY-stage 11 at a predetermined pitch and an operation of obtaining the image of the semiconductor chip 20 after the moving are repeated. Also, the amount of movement of the optical system XY-stage 11 is acquired from the encoder every time the optical system XY-stage 11 is caused to move. The amount of movement of the optical system XY-stage 11 may be obtained by using the pulse value for causing the optical system XY-stage 11 to move. Next, (4) the amount of movement and the direction of movement of the pattern are calculated through image recognition processing using images obtained every time the optical system XY-stage 11 is caused to move. Next, (5) a relationship (the size and the direction) between the position (the encoder or pulse position) of the optical system XY-stage 11 and the pixels of the first imaging device 30A and the second imaging device 31A is calculated by performing statistical processing on the amount of movement and the direction of movement of the pattern. The relationship is a second calibration value.

Process for Setting Camera Offset Value

The camera offset value is a moving distance required for the tool XY-stage 6 to perform bonding to the center of the first field-of-view 202 when the reference point 21 on the wire bonding unit mounted on the tool XY-stage 6 is at the center of the second field-of-view 203. The camera offset value in the present embodiment is another concept which is different from the camera offset as a term used in conventional wire bonder. FIG. 10 is a process table illustrating details of Process S3 for setting the camera offset value. In Process S3, a correlation between the optical system 10 and the bonding tool is set. The correlation between the optical system 10 and the bonding tool is also referred to as a camera offset value. Process S3 for setting the camera offset value includes a first operation S31 for setting the bonding point, a second operation S32 for forming bonding or indentation, and a third operation S33 for calculating the bonding position.

The first operation S31 includes the following operations. The optical system XY-stage 11 is caused to move such that the semiconductor chip 20 is placed within the first field-of-view 202 (see S31a, S31b, and (a) of FIG. 11). Next, a center 202C of the first field-of-view 202 is set as the bonding point (S31c). Then, the tool XY-stage 6 is caused to operate such that the reference point 21 is placed within the second field-of-view 203 (S31d). Next, the second field-of-view 203 is imaged (see S32e and (b) of FIG. 11). Then, calculation is performed (S31f). Specifically, the tool XY-stage coordinates read from the encoder are set to (x0, y0). Then, the position (x0s'. y0s') of the reference point 21 in the camera coordinates of the second field-of-view 203 is obtained through image recognition (see S31e and (b) of FIG. 11). Next, the coordinates are converted into an actual length (µm) on the basis of the previously obtained first calibration value from the camera coordinates which are pixel units. As a result, coordinates (x0s, y0s) are obtained. The XY coordinates and the direction of the tool XY-stage 6 and the scale are the same. The origin is the same as the camera coordinates of the second field-of-view 203. Therefore, the reference point 21 is the center of the second field-of-view 203 if the tool XY-stage 6 is caused to move by (−x0s, −y0s). In the actual operation, it is not necessary to cause the reference point 21 to move to the center of the field of view. After the first operation S31, the optical system XY-stage 11 evacuates (S31g).

The second operation S32 includes the following operations. The tool XY-stage 6 is caused to operate by the distance of the camera offset value stored in the device such that the capillary 1 moves to the bonding point (S32a). Next, the Z-axis drive section 5 performs bonding (S32b). An operation of forming indentation may be performed instead of the bonding operation. After the second operation S32, the optical system XY-stage 11 evacuates (S32c).

The third operation S33 includes the following operations. The optical system XY-stage 11 is caused to operate such that the bonding point 22 is placed within the first field-of-view 202 (S33a). The position of the optical system XY-stage 11 in S33a is the same as the position of the optical system XY-stage 11 in S31a and S31c. In other words, the output value of the encoder provided on the optical system XY-stage 11 or the pulse provided to the optical system XY-stage 11 is the same value. Next, the first field-of-view 202 is imaged (see S33b and (c) of FIG. 11). Then, calculation is performed (S33c). In this calculation, the bonding position with respect to the center of the first field-of-view 202 is obtained. First, coordinates (Xb', Yb') of the bonding point 22 are obtained on the basis of the camera coordinates of the first field-of-view 202. Next, the coordinates (Xb', Yb') are converted into the coordinates of the tool XY-stage 6. As a result, coordinates (Xb, Yb) are obtained. Next, the tool XY-stage 6 is caused to operate such that the reference point 21 is located within the second field-of-view 203 (S33d). Then, the second field-of-view 203 is imaged (see S33e and (d) of FIG. 11). Then, calculation is performed (S33f). Specifically, the tool XY-stage coordinates read from the encoder are set to (x1, y1). The position (x1s', y1s') of the reference point 21 in the camera coordinates of the second field-of-view 203 is obtained through image recognition. The position of the reference point 21 is converted into a coordinate scale of the tool XY-stage 6. As a result, the coordinates (x1s, y1s) are obtained.

The wire bonding apparatus 100 stores the camera offset value (Xc0, Yc0). The camera offset value changes due to a change in temperature or the like. The change (ΔXc, ΔYc) in camera offset value is as Equation (1) below when the values described above are used.

$$(\Delta Xc, \Delta Yc) = ((x1s - x1) - (x0s - x0) + Xb, (y1s - y1) - (y0s - y0) + Yb) \quad (1)$$

Therefore, the newly set camera offset value (Xc, Yc) is as Equation (2) below.

$$(Xc, Yc) = (Xc0 + \Delta Xc, Yc0 + \Delta Yc) = (Xc0 + (x1s - x1) - (x0s - x0) + Xb, Yc0 + (y1s - y1) - (y0s - y0) + Yb) \quad (2)$$

Process for Registering First Alignment Point

An alignment point is registered for each type of part as a target of the bonding (Process S4). In Process S4, the alignment point on the chip side is set. Specifically, (1) the semiconductor chip 20 on which bonding is to be performed is caused to move to the first field-of-view 202 by causing the optical system XY-stage 11 to operate first. Next, (2) an image is obtained by the first imaging device 30A, and an image is obtained by the second imaging device 31A, in a state where the semiconductor chip 20 is located within the first field-of-view 202. Then, (3) a characteristic region of the semiconductor chip 20 is registered as a first alignment point from the obtained images.

Process for Registering Second Alignment Point

An alignment point is registered for each type of part as a target of bonding (Process S5). In Process S5, the alignment point on the lead side is set. Specifically, (1) the optical system XY-stage 11 is caused to operate to move such that the lead of the semiconductor chip 20 on which bonding is performed is included in the first field-of-view 202. In a case where the second alignment point on the lead side is included inside the field-of-view where the first alignment point of the semiconductor chip 20 is registered, it is not necessary to cause the optical system XY-stage 11 to operate. In this case, the images obtained in Process S4 for registering the first alignment point may be used. Next, (2) an image is obtained by the first imaging device 30A, and an image is obtained by the second imaging device 31A, in a state where the semiconductor chip 20 on the lead side is located within the first field-of-view 202. Next, (3) the characteristic region of the semiconductor chip 20 on the lead side is registered as the second alignment point from the obtained images.

Process for Performing Pad Centering

Imaging is performed in a state where the individual pads are located within the first field-of-view 202 (Process S6). The individual images overlap each other in a specific region at an end of the field of view. As a result, it is possible to ascertain the position of the entire pads from the plurality of images. In a case where precision of the optical system XY-stage 11 is high, it is not necessary to cause the ends of the images to overlap each other.

Process for Performing Lead Locator

Process S7 for performing a lead locator is performed (see (a) of FIG. 12). The tool XY-stage 6 is caused to operate such that the individual leads 204 are located within the first field-of-view 202 (see FIG. 13) (S7a). Next, an image of the first field-of-view 202 is acquired (S7b). The image includes the individual leads 204. Imaging is performed in the state where the individual leads 204 are located within the first field-of-view 202. The individual images overlap in a specific region at an end of the field of view. As a result, it is possible to ascertain the position of the entire leads 204 from the plurality of images. In a case where precision of the optical system XY-stage 11 is high, it is not necessary to cause the ends of the images to overlap each other.

Process for Performing Positioning

Positioning is performed by a series of operations illustrated in the process table in (b) of FIG. 12 (Process S8). Process S8 for performing positioning includes a fourth operation S81 of performing alignment, a fifth operation S82 of acquiring a correlation, a sixth operation S83 of performing alignment, and a seventh operation S84 of acquiring a correlation. FIG. 13 is an illustrative example of the image of the first field-of-view 202 acquired in the fourth operation S81 of performing alignment. A most part of the semiconductor chip 20 is located within the first field-of-view 202. The part 102 is a part for holding the position of the semiconductor chip 20, such as a wind clamper.

The fourth operation S81 includes the following operations. The optical system XY-stage 11 is caused to operate such that a first lead alignment point L1, a first chip alignment point A1, and a second chip alignment point A2 are located within the first field-of-view 202 (S81a). Next, an image at a high magnification in the first field-of-view 202 is acquired using the first imaging device 30A (S81b). The image includes the first chip alignment point A1 and the second chip alignment point A2. Next, an image at a low magnification in the first field-of-view 202 is obtained using the second imaging device 31A (S81c). This image includes the first lead alignment point L1.

In the fifth operation S82, a correlation between the tool XY-stage 6 and the first imaging device 30A is acquired. Moreover, in the fifth operation S82, a correlation between the tool XY-stage 6 and the second imaging device 31A is also acquired. The tool XY-stage 6 is caused to operate such that the reference point 21 is located within the second field-of-view 203 (S82a). Next, an image of the second field-of-view 203 is acquired (S82b). Then, the tool is caused to evacuate using the tool XY-stage 6.

The sixth operation S83 includes the following operations. The optical system XY-stage 11 is caused to operate such that the second lead alignment point is located within the first field-of-view 202 (S83a). Next, an image at a low magnification in the first field-of-view 202 is acquired using the second imaging device 31A (S83b). The image includes the second lead alignment point.

In the seventh operation S84, a correlation between the tool XY-stage 6 and the first imaging device 30A is acquired. Moreover, in the seventh operation S84, a correlation between the tool XY-stage 6 and the second imaging device 31A is acquired. The tool XY-stage 6 is caused to operate such that the reference point 21 is located within the second field-of-view 203 (S84a). Then, the image of the second field-of-view 203 is acquired (S84b). Next, the tool including the reference point 21 is caused to evacuate using the tool XY-stage 6 (S84c).

In a case where the field of view is sufficiently wide, a twin-lens configuration including the optical system at a low magnification and the optical system at a high magnification is not needed. In other words, in a case where the field of view is sufficiently wide, a single lens may be used. "Single lens" and "twin lenses" may be understood as indicating the numbers of optical systems at mutually different magnifications or the like.

Effects

The wire bonding apparatus 100 includes a bonding stage 7 on which the semiconductor chip 20 is mounted, a wire bonding unit 40 including the capillary 1 bonding the bonding wire 200 to the semiconductor chip 20, the Z-axis drive section 5 causing the capillary 1 to reciprocate, and the tool XY-stage 6 causing the capillary 1 and the Z-axis drive section 5 to move along a two-dimensional plane intersecting the direction of the reciprocation, the optical system 10, and the optical system XY-stage 11 that causes the optical system 10 to move along the two-dimensional plane intersecting the direction of the reciprocation and also includes the base 70 to which the wire bonding unit 40 is attached. The wire bonding unit 40 is attached to the first portion 71a of the base 70. The optical system XY-stage 11 is attached to the second portion 71b which is different from the first portion 71a of the base 70.

In the wire bonding apparatus 100, each of the wire bonding unit 40 and the imaging unit 50 is attached to a mutually different portion of the base 70. Thus, vibration generated by operations of the XY-stage and the capillary drive section does not act on a cantilever structure of the imaging unit 50 and lead to unintended vibration in the capillary 1 as in the conventional structure. Since the vibration generated by the operations of the imaging unit 50 can be sufficiently attenuated before it reaches the wire bonding unit 40, the vibration is unlikely to affect the operations of the wire bonding unit 40. Therefore, it is possible to perform bonding in a satisfactory state and thereby to curb degradation of bondability.

In the wire bonding apparatus 100 according to the present embodiment, the optical system 10 for positioning is not mounted in the same tool XY-stage 6 as the bonding tool including the Z-axis drive section 5. With this configuration, the following several advantages are achieved. First, a mass that the tool XY-stage 6 bears decreases. Therefore, the load of the tool XY-stage 6 decreases. As a result, it is possible to further shorten the moving time of the bonding tool and thereby to improve an index (unit per hour (UPH)) indicating the processing time required for one processed part (unit). Furthermore, the system intervening between the imaging unit 50 and the wire bonding unit 40 is simple and has a short distance. As a result, it is easy to correct thermal deformation caused by a change in temperature between the imaging unit 50 and the wire bonding unit 40.

Vibration of the optical system 10 and the Z-axis drive section 5 which is a bonding head can affect the control system. However, the optical system 10 for positioning is not mounted on the same tool XY-stage 6 as the bonding tool. Therefore, influences of the vibration of the optical system 10 on the Z-axis drive section 5 are reduced. As a result, it is not necessary to provide a time (vibration settling timer) for waiting for attenuation of the vibration of the optical system 10, the Z-axis drive section 5, and the tool XY-stage 6. Therefore, it is possible to further improve UPH. Moreover, the optical system 10 is not mounted on the high-speed tool XY-stage 6. Therefore, it is possible to alleviate the limitation to the shape and the mass of the optical system 10. As a result, it is possible to mount a new function such as inspection on the optical system 10.

The wire bonding apparatus 100 according to the present embodiment can also exhibit the following effects and advantages. First, the mass of the part mounted on the tool XY-stage 6 is reduced. Specifically, the mass of the imaging unit 50 is reduced. As a result, it is possible to reduce a load of a motor for driving the tool XY-stage 6. For example, it is possible to reduce the load of the motor for the tool XY-stage 6 to about half. As a result, it is possible to reduce the moving time by 30% in simple calculation. It is thus possible to further increase the bonding speed. As a result, it is possible to improve the index (unit per hour (UPH)) indicating the processing time required for one processed part (unit).

Moreover, it used to be necessary to mount the optical system 10 configuring the imaging unit 50 on a stage capable of moving at a high speed. Therefore, there used to be significant limitations for the imaging unit 50 regarding the shape, the mass, the structure, and the like for enabling the high-speed movement. However, it is possible to alleviate the limitations to some extent by providing the imaging unit 50 as a separate element from the wire bonding unit 40. As a result, it is possible to mount a part for realizing a new function such as inspection on the imaging unit 50 or the wire bonding unit 40.

It is possible to curb influences of the vibration of the optical system 10 configuring the imaging unit 50 on the control system for the wire bonding unit 40 including the capillary 1. As a result, it becomes easier to control the wire bonding unit 40. Furthermore, the vibration of the optical system 10 configuring the imaging unit 50 does not affect the capillary 1 which is a bonding tool. As a result, it is possible to improve bondability. Moreover, in a case where it is not possible to ignore influences of the vibration of the optical system 10 configuring the imaging unit 50, it is necessary to wait for vibration generated in various parts configuring the wire bonding apparatus 100 being attenuated. However, in the wire bonding apparatus 100, influences of the vibration of the optical system 10 configuring the imaging unit 50 are curbed. In other words, the influences of the vibration of the optical system 10 can be substantially ignored. Therefore, the time for waiting for the vibration being attenuated is not necessary. As a result, it is possible to improve the aforementioned UPH.

An image of the reference point 21 of the tool XY-stage 6 is acquired using the optical system for positioning. A correlation between the optical system 10 and the tool XY-stage 6 is obtained. It is also possible to correct a change in bonding offset due to a change in temperature or the like through the acquisition of the correlation. This can be used instead of a function of imaging the distal end position of the capillary 1 (reference positioning system (RPS)). It is thus possible to omit the mounting of the RPS function on the wire bonding apparatus 100. As a result, it is possible to enlarge the bonding area in the Y direction.

In a case where a temperature correction is performed for a change in offset, factors to be considered in the correction are movement of the reference point 21 and movement of the first field-of-view 202. The movement of the reference point 21 is caused by extension of the bonding tool and extension of the ultrasonic horn 2, for example. The movement of the first field-of-view 202 is caused by extension of the distal end part of the optical system, for example. The distal end part of the optical system means a part on the side closer to the object surface than the splitter half mirror. In other words, the number of factors to be considered in the correction is small, and the factors are simple. Therefore, it is possible to easily perform the temperature correction.

In short, the device according to the present embodiment is a wire bonder in which the bonding tool is mounted on the tool XY-stage 6 which is a movable stage. The wire bonder acquires an image of the bonding target and an image of the reference point 21 on the movable stage by the optical system installed outside the movable stage. Then, the positional relationship between the bonding target and the bonding tool is calculated using the coordinates obtained from the images and the coordinates of the movable stage.

The optical system of the aforementioned wire bonder may be mounted on the movable stage. Moreover, the aforementioned wire bonder may acquire the image of the bonding target and the image of the reference point 21 by the same imaging device. Moreover, the aforementioned wire bonder may have the reference point 21 on the ultrasonic horn or the horn holder. Furthermore, the aforementioned wire bonder may acquire the image of the bonding target and the image of the reference point 21 using the same lens.

According to the wire bonding apparatus 100 having the aforementioned configuration, it is possible to realize an improvement in bonding speed, an improvement in UPH, an improvement in bonding precision, and an improvement in bondability. Additionally, according to the wire bonding apparatus 100, it is also possible to enlarge the bonding area.

The embodiment of the wire bonding apparatus has been described hitherto. The wire bonding apparatus is not limited to the aforementioned embodiment.

Modifications of Optical Path Configuration

A desired configuration may be employed as a configuration for causing the optical path length from the first field-of-view 202 to the first imaging device 30A and the second imaging device 31A and the optical path length from the second field-of-view 203 to the first imaging device 30A and the second imaging device 31A to coincide with each other. FIG. 14 illustrates an example of the optical path configuration in such a case. As illustrated in FIG. 14 and FIG. 15, a configuration in which the optical paths are folded by a plurality of mirrors such that the distances in the air coincide with each other may be employed. An imaging unit 50A further includes an optical path length correction member 95 in addition to the configuration of the imaging unit 50 according to the embodiment. The imaging unit 50A may include additional optical parts 30C and 30D (see FIG. 15) as needed. The optical path length correction member 95 is disposed between the half mirror 37 and the half mirror 38. The optical path length correction member 95 configures optical paths for preforming four-time reflection using the plurality of mirrors 41, 42, 43, and 44 as illustrated in FIG. 15. The optical path lengths are corrected by the optical path configuration. A prism may be employed instead of the mirrors 41, 42, 43, and 44.

An optical system 10B illustrated in FIG. 16 includes lenses 30E and 30F and an optical path length correction member 95A. The optical path length correction member 95A is an optical member 96 made of a material that is disposed on the optical paths and having a refractive index that is different from that of air. The optical path length correction member 95A includes a mirror for folding the optical paths, an optical member having a refractive index that is different from that of air, and the like. Due to properties of the lens, if the optical path length from an image surface to a rear-side main plane of the lens is shortened due to the optical path length passing in glass, then the focus position is shortened. Therefore, the configuration as in FIG. 16 is possible.

In the modification illustrated in FIG. 15, the first field-of-view 202 is right above the capillary when the reference point 21 is seen in the second field-of-view 203 unlike the modification in FIG. 3. In other words, the camera offset value in the X direction is close to zero. Therefore, if the tool evacuates from the state where the reference point 21 is seen in the second field-of-view 203, it is possible to see the target of bonding in the vicinity of the bonding point in the first field-of-view 202 as it is. It is possible to simplify the structure of the optical system and the positioning method as compared with the modification illustrated in FIG. 3 by using the structure.

The configuration of the optical system 10 is not limited to the configuration in which the optical path length from the first field-of-view 202 to the first imaging device 30A and the second imaging device 31A and the optical path length from the second field-of-view 203 to the first imaging device 30A and the second imaging device 31A are caused to coincide with each other. It is also possible to employ a configuration in which the first field-of-view 202 is focused while the second field-of-view 203 is also focused even if the optical path lengths are different. For example, the optical system may be configured to include a lens, a mirror with a curvature, or a prism.

A configuration for mechanically causing the positions of the optical elements such as the lens and the mirror to move may be employed. Such a configuration is an optical system including a function of adjusting the focus through driving of the lens. An optical system including a function of performing correction by changing the curvature of the optical elements may be employed. As such an optical system, a liquid lens is employed. In this case, the magnification of the first field-of-view 202 and the magnification of the second field-of-view 203 do not coincide with each other as they are. Therefore, it is necessary to correct the magnifications.

Modifications of Position where Reference Point is Provided

As illustrated in FIG. 17, the member where the reference point 21 is provided is not limited to the ultrasonic horn 2. For example, a reference point 21A may be provided at the distal end of the torch arm 91 which is an arm member provided to project from above the tool XY-stage 6. A reference point 21B may be provided at the horn holder 4. A reference point 21C may be provided on the upper surface of the Z-axis drive section 5 which is a bonding head.

Modifications of Process for Setting Camera Offset Value

The process for setting the camera offset value is not limited to a series of operations illustrated in FIG. 10 and the like. FIG. 18 illustrates another series of operations (Process S9) that can be employed instead of aforementioned Process S3 for setting the camera offset value. In the modification, image recognition of a characteristic pattern is performed. As a result, it is possible to set the camera offset value without using the reference point 21.

FIG. 18 is a process table illustrating details of the modification of Process S9 for setting the camera offset value. The process S9 for setting the camera offset value includes an eighth operation S91 for setting the bonding point, a ninth operation S92 for forming bonding or indentation, and a tenth operation S93 for calculating the bonding position.

The eighth operation S91 includes the following operations. The optical system XY-stage 11 is caused to operate such that the semiconductor chip 20 is located in the first field-of-view 202 (S91a, S91b). Next, the bonding point is set using reticle in the first field-of-view 202 (S91c). Then, calculation is performed (S91d). Specifically, the relative position of the set bonding point with respect to the characteristic pattern in the first field-of-view 202 is obtained. The relative position follows the camera coordinates (Xb2', Yb2'). After the eighth operation S91, the optical system XY-stage 11 evacuates (S91e). Next, the tool XY-stage 6 is caused to operate (S91f), and the reference point 21 is disposed in the second field-of-view 203 (S91g). Then, image recognition of the reference point 21 is performed, and the position of the reference point 21 inside the second field-of-view 203 is obtained (S91h).

The ninth operation S92 includes the following operations. The tool XY-stage 6 is caused to operate such that the capillary 1 moves to the bonding point (S92a). The moving distance is a value obtained by subtracting deviation of the reference point 21 with respect to the center of the second field-of-view 203 obtained in S91 from the camera offset stored in the device. In other words, the tool XY-stage 6 moves in the same manner as in a case where the reference point 21 is at the center of the second field-of-view 203 and has moved by the stored camera offset. Next, the Z-axis drive section 5 performs bonding (S92b). An operation of forming indentation may be performed instead of the bonding operation. Thereafter, the tool XY-stage 6 evacuates (S92c).

The tenth operation S93 includes the following operations. The optical system XY-stage 11 is caused to operate such that the bonding point is located within the first field-of-view 202 (S93a). Next, the bonding point located within the first field-of-view 202 is imaged (S93b). Then, calculation is performed (S93c). Specifically, the relative position of the set bonding point with respect to the characteristic pattern in the first field-of-view 202 is obtained. The relative position follows the camera coordinates (Xb3', Yb3').

The camera offset value stored in the device is assumed to be (Xc0, Yc0). A previously set value or a designed value at the time of production of the device may be employed as the camera offset value. A change in camera offset value is (Xb3'−Xb2', Yb3'−Yb2') on the basis of the camera coordinates. A change in camera offset value converted into the coordinates of the tool XY-stage 6 is (Xb3−Xb2, Yb3−Yb2). As a result, a correlation between the position of the field-of-view center of the optical system and the position where the tool is lowered is (Xc, Yc)=(Xc0+Xb3−Xb2, Yc0+Yb3−Yb2).

Other Modifications

In the present embodiment, images of the semiconductor chip 20 which is a target of bonding and the reference point 21 are acquired using the common imaging device. For example, the wire bonding apparatus 100 may include as an imaging device for acquiring the image of the target of the bonding and an imaging device for acquiring the image of the reference point 21 as separate imaging devices.

In the present embodiment, the image is obtained with the target of the bonding located within the first field-of-view 202, and the image is obtained with the reference point 21 located within the second field-of-view 203. For example, the image may be obtained with the target of the bonding and the reference point 21 located within either the first field-of-view 202 or the second field-of-view 203. In other words, operations may be performed to merge the first field-of-view 202 and the second field-of-view 203.

A plurality of images may be obtained by imaging the opening of the wind clamper in the frame a plurality of times. Then, the images may be synthesized, and bonding may be performed using the reference point 21 as a reference.

The invention claimed is:
1. A wire bonding apparatus comprising:
a bonding stage on which a bonding target is mounted;
a wire bonding unit comprising a capillary bonding a bonding wire to the bonding target, a capillary drive section reciprocating the capillary, and a first XY-stage causing the capillary and the capillary drive section to be moved along a two-dimensional plane intersecting a direction of the reciprocation;
an imaging unit imaging the bonding target mounted on the bonding stage and comprising a second XY-stage that is independent of the first XY-stage; and
a base to which the wire bonding unit and the imaging unit are attached,
wherein the wire bonding unit is attached to a first portion of the base,
the imaging unit is attached to a second portion that is different from the first portion of the base,
in the wire bonding unit, a reference point that represents a position of the wire bonding unit is provided on a surface that can be imaged by the imaging unit,
the base comprises a sub-frame and a main frame rising from the sub-frame,
the first XY-stage is attached to the sub-frame and the second XY-stage is attached to the main frame, and
the main frame is not directly in contact with the first XY-stage.

2. The wire bonding apparatus according to claim 1, wherein the imaging unit images the reference point and images the bonding target mounted on the bonding stage.

3. The wire bonding apparatus according to claim 2, wherein the imaging unit obtains a first image comprising the reference point and a second image that comprises the bonding target and is different from the first image.

4. The wire bonding apparatus according to claim 3, further comprising a control section acquiring a calibration value obtained by calculating a correlation between field-of-view coordinates of the reference point in the first image and position coordinates of the first XY-stage.

5. The wire bonding apparatus according to claim 4, wherein the reference point is provided on an upper surface of an ultrasonic horn of the wire bonding unit.

6. The wire bonding apparatus according to claim 1, wherein the imaging unit comprises an imaging section and a camera drive section causing the imaging section to be moved along a two-dimensional plane intersecting a direction of the reciprocation.

7. The wire bonding apparatus according to claim 5, wherein the imaging unit comprises an imaging device and an optical system guiding light from the bonding target and the reference point to the imaging device,
the optical system comprises a lens and an optical splitter section disposed on an optical axis between the imaging device and the bonding target and between the imaging device and the reference point,
the lens is disposed on an optical axis between the imaging device and the optical splitter section, and
the optical splitter section is disposed on an optical axis between the bonding target and the lens and between the reference point and the lens.

8. The wire bonding apparatus according to claim 7, wherein the optical splitter section comprises a half mirror and an illumination irradiating the half mirror with light, and
the optical splitter section performs switching between an optical path acquiring the first image and an optical path acquiring the second image with the light with which the half mirror is irradiated.

9. The wire bonding apparatus according to claim 2, wherein the imaging unit comprises an imaging section and a camera drive section causing the imaging section to be moved along a two-dimensional plane intersecting a direction of the reciprocation.

10. The wire bonding apparatus according to claim 3, wherein the imaging unit comprises an imaging section and a camera drive section causing the imaging section to be moved along a two-dimensional plane intersecting a direction of the reciprocation.

11. The wire bonding apparatus according to claim 4, wherein the imaging unit comprises an imaging section and a camera drive section causing the imaging section to be moved along a two-dimensional plane intersecting a direction of the reciprocation.

12. The wire bonding apparatus according to claim 5, wherein the imaging unit comprises an imaging section and a camera drive section causing the imaging section to be moved along a two-dimensional plane intersecting a direction of the reciprocation.

13. The wire bonding apparatus according to claim 6,
wherein the imaging unit obtains a first image comprising the reference point and a second image that comprises the bonding target and is different from the first image,
wherein the wire bonding apparatus further comprises a control section acquiring a calibration value obtained by calculating a correlation between field-of-view coordinates of the reference point in the first image and position coordinates of the first XY-stage, and
wherein the control section calculates coordinates of the reference point converted based on the calibration value in the second image, drives the camera drive section to obtain coordinates of a bonding point such that the bonding point is placed within a field-of-view for obtaining the first image, and then drives the first XY-stage to acquire a camera offset value such that the reference point is placed within a field-of-view for obtaining the second image.

14. The wire bonding apparatus according to claim 9,
wherein the imaging unit obtains a first image comprising the reference point and a second image that comprises the bonding target and is different from the first image,
wherein the wire bonding apparatus further comprises a control section acquiring a calibration value obtained by calculating a correlation between field-of-view coordinates of the reference point in the first image and position coordinates of the first XY-stage, and
wherein the control section calculates coordinates of the reference point converted based on the calibration value in the second image, drives the camera drive section to obtain coordinates of a bonding point such that the bonding point is placed within a field-of-view for obtaining the first image, and then drives the first XY-stage to acquire a camera offset value such that the reference point is placed within a field-of-view for obtaining the second image.

15. The wire bonding apparatus according to claim 10,
wherein the imaging unit obtains a first image comprising the reference point and a second image that comprises the bonding target and is different from the first image,
wherein the wire bonding apparatus further comprises a control section acquiring a calibration value obtained by calculating a correlation between field-of-view coordinates of the reference point in the first image and position coordinates of the first XY-stage, and
wherein the control section calculates coordinates of the reference point converted based on the calibration value in the second image, drives the camera drive section to obtain coordinates of a bonding point such that the bonding point is placed within a field-of-view for obtaining the first image, and then drives the first XY-stage to acquire a camera offset value such that the reference point is placed within a field-of-view for obtaining the second image.

16. The wire bonding apparatus according to claim 11,
wherein the imaging unit obtains a first image comprising the reference point and a second image that comprises the bonding target and is different from the first image,
wherein the wire bonding apparatus further comprises a control section acquiring a calibration value obtained by calculating a correlation between field-of-view coordinates of the reference point in the first image and position coordinates of the first XY-stage, and
wherein the control section calculates coordinates of the reference point converted based on the calibration value in the second image, drives the camera drive section to obtain coordinates of a bonding point such that the bonding point is placed within a field-of-view for obtaining the first image, and then drives the first XY-stage to acquire a camera offset value such that the reference point is placed within a field-of-view for obtaining the second image.

17. The wire bonding apparatus according to claim 12,
wherein the imaging unit obtains a first image comprising the reference point and a second image that comprises the bonding target and is different from the first image,
wherein the wire bonding apparatus further comprises a control section acquiring a calibration value obtained by calculating a correlation between field-of-view coordinates of the reference point in the first image and position coordinates of the first XY-stage, and
wherein the control section calculates coordinates of the reference point converted based on the calibration value in the second image, drives the camera drive section to obtain coordinates of a bonding point such that the bonding point is placed within a field-of-view for obtaining the first image, and then drives the first XY-stage to acquire a camera offset value such that the reference point is placed within a field-of-view for obtaining the second image.

* * * * *